(12) United States Patent
Yoneda

(10) Patent No.: US 8,889,503 B2
(45) Date of Patent: Nov. 18, 2014

(54) METHOD FOR MANUFACTURING SEMICONDUCTOR DEVICE

(71) Applicant: Panasonic Corporation, Osaka (JP)

(72) Inventor: Kenji Yoneda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/104,289

(22) Filed: Dec. 12, 2013

(65) Prior Publication Data

US 2014/0106521 A1    Apr. 17, 2014

Related U.S. Application Data

(63) Continuation of application No. PCT/JP2012/003792, filed on Jun. 11, 2012.

(30) Foreign Application Priority Data

Jun. 13, 2011    (JP) ................................. 2011-131684

(51) Int. Cl.
| | |
|---|---|
| H01L 21/336 | (2006.01) |
| H01L 21/265 | (2006.01) |
| H01L 21/687 | (2006.01) |
| H01L 29/66 | (2006.01) |
| H01L 29/04 | (2006.01) |

(52) U.S. Cl.
CPC . *H01L 21/26513* (2013.01); *H01J 2237/24528* (2013.01); *H01L 21/26586* (2013.01); *H01L 21/68771* (2013.01); *H01L 29/6659* (2013.01); *H01L 21/68764* (2013.01); *H01L 29/045* (2013.01); *H01J 2237/20207* (2013.01); *H01J 2237/31701* (2013.01); *H01L 29/6656* (2013.01)
USPC .... 438/198; 438/514; 438/525; 257/E21.334; 257/E21.337; 257/E21.342

(58) Field of Classification Search
CPC ................... H01L 21/26506; H01L 21/26513; H01L 21/2652; H01L 29/045; H01L 2237/20207

USPC .................................. 438/514; 257/E21.342
See application file for complete search history.

(56) References Cited

U.S. PATENT DOCUMENTS

| | | | |
|---|---|---|---|
| 5,838,058 A | 11/1998 | Kitajima et al. | |
| 7,256,478 B2 * | 8/2007 | Toba et al. | ..................... 257/627 |

(Continued)

FOREIGN PATENT DOCUMENTS

| | | |
|---|---|---|
| JP | 10-270374 | 10/1988 |
| JP | 7-172990 | 7/1995 |

(Continued)

OTHER PUBLICATIONS

International Search Report issued in International Application No. PCT/JP2012/003792 on Sep. 4, 2012.

(Continued)

*Primary Examiner* — Reema Patel
*Assistant Examiner* — Syed Gheyas
(74) *Attorney, Agent, or Firm* — Wenderoth, Lind & Ponack, L.L.P.

(57) ABSTRACT

Provided is a method for manufacturing a semiconductor device which includes, on a wafer which has a notch, a plurality of transistors parallel with and perpendicular to a notch direction extending between the center of the wafer and the notch, the method including: preparing the wafer having the front surface which has Off angle of at least 2 degrees and at most 2.8 degrees from plane in a direction in which Twist angle relative to the notch direction is at least 12.5 degrees and at most 32.5 degrees; and doping impurities into the front surface of the wafer in a direction perpendicular to the front surface.

16 Claims, 16 Drawing Sheets

(56) References Cited

U.S. PATENT DOCUMENTS

| | | | |
|---|---|---|---|
| 7,291,535 B2 * | 11/2007 | Niwayama et al. | 438/302 |
| 7,541,211 B2 | 6/2009 | Tamura et al. | |
| 7,977,760 B2 * | 7/2011 | Tamura et al. | 257/462 |
| 2006/0141655 A1 | 6/2006 | Tamura et al. | |
| 2006/0264013 A1 * | 11/2006 | Rouh et al. | 438/514 |
| 2007/0045571 A1 * | 3/2007 | Woo | 250/492.21 |
| 2009/0218602 A1 | 9/2009 | Tamura et al. | |

FOREIGN PATENT DOCUMENTS

| | | |
|---|---|---|
| JP | 3145851 | 3/2001 |
| JP | 2006-186204 | 7/2006 |
| JP | 2006-253029 | 9/2006 |
| JP | 2008-66643 | 3/2008 |

OTHER PUBLICATIONS

Kenji Yoneda et al., "The Drain Current Asymmetry of 130nm MOSFETs due to Extension Implant Shadowing Originated by Mechanical Angle Error in High Current Implanter", Extended Abstracts of 3rd International Workshop on junction Technology, 2002.

* cited by examiner

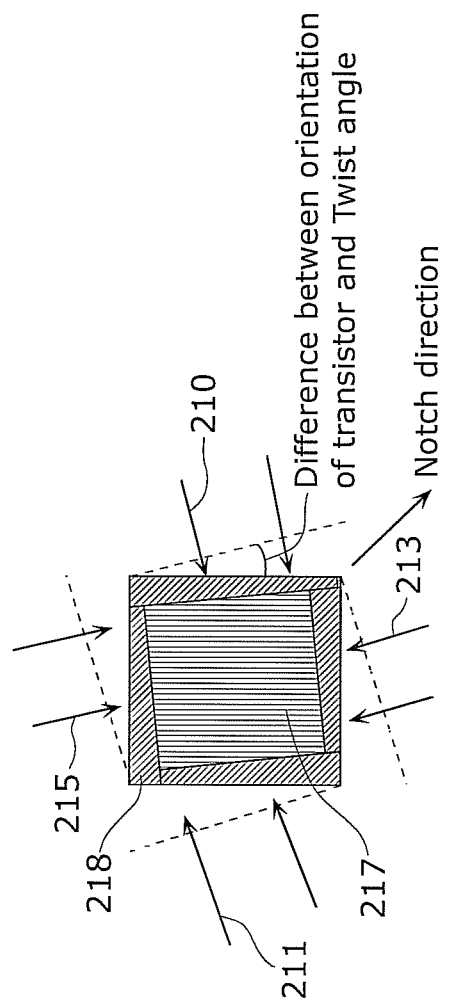

METHOD FOR MANUFACTURING SEMICONDUCTOR DEVICE

CROSS REFERENCE TO RELATED APPLICATIONS

This is a continuation application of PCT Patent Application No. PCT/JP2012/003792 filed on Jun. 11, 2012, designating the United States of America, which is based on and claims priority of Japanese Patent Application No. 2011-131684 filed on Jun. 13, 2011. The entire disclosures of the above-identified applications, including the specifications, drawings and claims are incorporated herein by reference in their entirety.

FIELD

The present invention relates to a method for manufacturing a semiconductor device, and more particularly, to an impurity doping method for forming an MOS transistor by ion doping.

BACKGROUND

In recent years, a semiconductor integrated circuit, among others, complementary metal oxide semiconductors (CMOS), charge coupled devices (CCD), CMOS image sensors (CIS) are manufactured using techniques of preventing, at impurity doping into a microscopic region by ion doping, impurities from being doped into locations deeper than expected, due to ion channeling.

Channeling phenomenon (Hereinafter, referred to as "channeling.") is a phenomenon in which when ions are doped substantially in parallel with the crystallographic axis or crystal planes of a crystalline material, due to the geometric arrangement of atoms forming the crystal lattice, doped ions pass through lattice spacing without colliding with the atoms composing the crystal. For convenience, the channeling can be categorized into axis-channeling along with a low order crystallographic axis such as <100> direction, and plane-channeling along with low order crystal planes such as (100) plane and (111) plane. When ion doping which causes the channeling is performed, variation in depth to which doped ions extend is great as compared to when ions are doped nonparallel with the crystallographic axis or the crystal planes.

Known technique for preventing the channeling is, typically, setting an ion beam angle, which is called Tilt angle, relative to the normal (the vertical direction) of the front surface of a wafer (semiconductor substrate) to about 3 to about 10 degrees, generally, 7 degrees to prevent the channeling.

On the other hand, when Tilt angle is not zero degree, while the channeling can be prevented, phenomenon known as shadowing occurs in an ion doping step which is performed after structures of resist and gate electrodes are formed. The shadowing is a phenomenon in which ions are not doped into a portion of the wafer that is shaded by such structures.

Non Patent Literature (NPL) 1 discloses that a portion of a wafer is shaded by a gate electrode due to errors in Tilt angle and Twist angle in a large current ion implantation apparatus, and thus ions at extension doping and source-drain doping are not performed symmetric to the wafer, ending up increasing drain current asymmetry. NPL 1 also discloses that 4-step doping is effective as a measure to this. For example, when the resist thickness is 600 nm, a portion of the wafer 73.6 nm (600 nm×tan 7 degrees) extending from the resist is shaded by the resist, and ions are not doped into the portion. To prevent this, the ion doping is performed on the structures in four directions, thereby mitigating the asymmetry of the ion doping.

On the other hand, in recent semiconductor devices, some transistors have channels not only in parallel with and perpendicular to but also 45 degrees tilted relative to a notch direction. In that case, the ion doping needs to be performed in eight directions. In other words, it is essential to develop an ion doping technology which can minimize the shadowing due to the structures such as resist and gates, and inhibiting the channeling in the ion doping.

Various problems occur in a conventional method, with use of an ion beam having Tilt angle set to 7 degrees, which performs the ion doping in four steps or eight steps, rotating a wafer so that the ion beam is not shaded by the structures such as resist and gates. As mentioned earlier with respect to the asymmetry of the ion doping due to the shadowing of structures, even if the ion doping is performed in multiple steps, for example, four steps, at least one ion doping is not performed on a portion that is shaded by the structures, as compared to that ion doping is performed four times on a portion that is not shaded by the structures. After all, ions are doped, undesirably, three times on the portion shaded by the structures while ions are doped four times on the portion that is not shaded by the structures. In other words, the asymmetry of ion doping is reduced but not entirely eliminated.

Moreover, in the ion doping in multiple steps, Twist angle of the wafer needs to be changed at every doping (the wafer is rotated by 90 degrees for four steps, and rotated by 45 degrees for eight steps). Because the doping step is divided into sub-steps in addition to these operations, the beam current is reduced to provide uniformity, ending up significantly decreasing productivity. Because of this, a method is proposed which does not perform the ion doping step in multiple steps, and provides, to inhibit the channeling, the front surface of a silicon substrate with a desired Off angle (wafer cutting angle from silicon ingot) for use in manufacturing the semiconductor device (see Patent Literature (PTL) 1 and NPL 1, for example).

PTL 1 discloses that the channeling can be inhibited by using a silicon substrate which has a silicon front surface having Off angle of 3.5 to 10 degrees from (100) plane toward a plane perpendicular to (100) plane, and performing the ion doping perpendicular to the silicon front surface. NPL 1 assumes that the control precision of Tilt angle in wafer-plane by the ion implantation apparatus has an error of ±1.6 degrees, and further assumes that angle error due to the setting of the wafer to the ion implantation apparatus is ±1 degree. Moreover, NPL 1 assumes that an error in controllability of Off angle of the wafer is ±0.5 degree.

The assumption requires Off angle to be 4 degrees or greater, and additionally, considers the ion beam divergence in the wafer-plane, in addition to the angle error of the ion implantation apparatus which is 1.6±1 degrees. Thus, Off angle relative to the plane ends up being relatively large ranging from 4 degrees to 10 degrees.

NPL 1 considers not only the channeling due to Tilt angle but also the plane-channeling, and determines the direction of Off angle, based on at least two directions that are perpendicular to (100) plane. The ion doping is performed perpendicular to the front surface even if Off angle is largely tilted. Thus, it seems that no portion of the wafer is shaded by the structures such as resist and gate electrodes. However, NPL 1 discloses that an error in the beam angle in the wafer-plane in the ion implantation apparatus is ±1.6 degrees, and the angle error due to the setting of the wafer is ±1 degree. Thus, the technique disclosed in NPL 1 may require multi-step ion doping to eliminate the asymmetry caused by the angle error in the ion implantation apparatus.

CITATION LIST

Patent Literature

[PTL 1] Japanese Unexamined Patent Application Publication No. H7-172990

Non Patent Literature

[NPL 1] Extended Abstracts of 3rd International Workshop on junction Technology, "The Drain Current Asymmetry of 130 nm MOSFETs due to Extension Implant Shadowing Originated by Mechanical Angle Error in High Current Implanter", K. Yoneda et al., 2002

SUMMARY

Technical Problem

The technology disclosed in PTL 1 expects that the angle error in cutting a wafer from silicon ingot is ±0.5 degree, and, in addition, error in setting the wafer to the ion implantation apparatus is ±1 degree, and error in Tilt angle in the wafer-plane in the ion doping is ±1.6 degrees. Thus, Off angle of the front surface to (100) plane is at a minimum of 4 degrees or greater. When Off angle is increased, however, the front surface on which semiconductor devices are formed, of course, deviates from (100) plane on which the semiconductor devices should be formed. Thus, the interface state density of the front surface of the wafer tends to increase and electron and hole mobility decrease, which may cause an increase in interface state that affects device characteristics, among others, the drive strength of an MOS transistor and white spot defect with imaging devices.

In view of the above problems, an object of the present invention is to provide a method for manufacturing a semiconductor device which includes an MOS transistor in which characteristic variation due to the channeling is reduced and the asymmetry due to shadowing is reduced.

Solution to Problem

To achieve the above object, a method for manufacturing a semiconductor device according to the present invention is a method for manufacturing a semiconductor device which includes, on a semiconductor substrate having a notch, a plurality of transistors in parallel with and perpendicular to a notch direction extending between a center of the semiconductor substrate and the notch, the method including: preparing the semiconductor substrate which has a front surface having an Off angle of at least 2 degrees and at most 2.8 degrees from (100) plane in a direction in which a Twist angle relative to the notch direction is at least 12.5 degrees and at most 32.5 degrees; and doping impurities into the front surface of the semiconductor substrate in a direction perpendicular to the front surface.

According to the above configuration, a semiconductor device can be manufactured which includes an MOS transistor in which the variations in threshold voltage due to variations in depth of the ion doping due to the channeling are reduced and the asymmetry due to the shadowing is reduced.

Moreover, impurities can be doped into a semiconductor substrate without variation in one step, without doping impurities into the semiconductor substrate rotating the semiconductor substrate along with directions in which a plurality of transistors are formed.

Moreover, for example, the Twist angle is 22.5 degrees.

According to the above configuration, a plurality of transistor can be formed on the semiconductor substrate in directions in which the channeling is less likely to occur.

Moreover, for example, the notch is formed at a periphery of the semiconductor substrate in <0-11> direction, and the plurality of transistors are formed on the semiconductor substrate in the <0-11> direction and <011> direction, or in <001> direction and <010> direction.

Moreover, for example, the notch is formed at a periphery of the semiconductor substrate in <0-11> direction, and the plurality of transistors are formed on the semiconductor substrate in the <0-11> direction, <011> direction, <001> direction, and <010> direction.

According to the above configuration, a plurality of transistor can be formed on the semiconductor substrate in directions in which the channeling is less likely to occur.

Moreover, for example, an error angle of the Off angle is within ±0.1 degree.

Moreover, for example, the vertical direction is a direction of 0±0.15 degree relative to the front surface of the semiconductor substrate.

According to the above configuration, a transistor which has no characteristic variation due to the channeling can be formed even if the precision in plane of the semiconductor substrate has the above-described error.

Moreover, for example, doping the impurities is to form channel regions of the plurality of transistors.

According to the above configuration, a channel region of a transistor can be formed which has reduced characteristic variation due to the channeling.

Moreover, for example, doping the impurities is to form source-drain regions of the plurality of transistors.

According to the above configuration, a source-drain region of a transistor can be formed which has no characteristic variation due to the channeling.

Moreover, for example, doping the impurities is to form extension regions of the plurality of transistors.

According to the above configuration, an extension region of a transistor can be formed which has no characteristic variation due to the channeling.

Advantageous Effects

According to the method for manufacturing the semiconductor device of the present invention, a semiconductor device can be provided which includes an MOS transistor in which characteristic variation due to the channeling is reduced and the asymmetry due to shadowing is reduced.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 8C is a top view of an ion-doped region of a wafer.

DESCRIPTION OF EMBODIMENTS

First, a conventionally used batch ion implantation apparatus and a serial ion implantation apparatus according to an embodiment of the present invention will be described. It should be noted that "Off angle" refers to an angle (wafer cutting angle from silicon ingot) of the front surface of a semiconductor substrate relative to (001) plane of the semiconductor substrate. "Twist angle" refers to an angle of a direction in which Off angle is created relative to a notch direction of the semiconductor substrate. "Tilt angle" refers to an angle of incidence of the ion beam relative to a direction perpendicular to the front surface of the semiconductor substrate.

Figure 1:
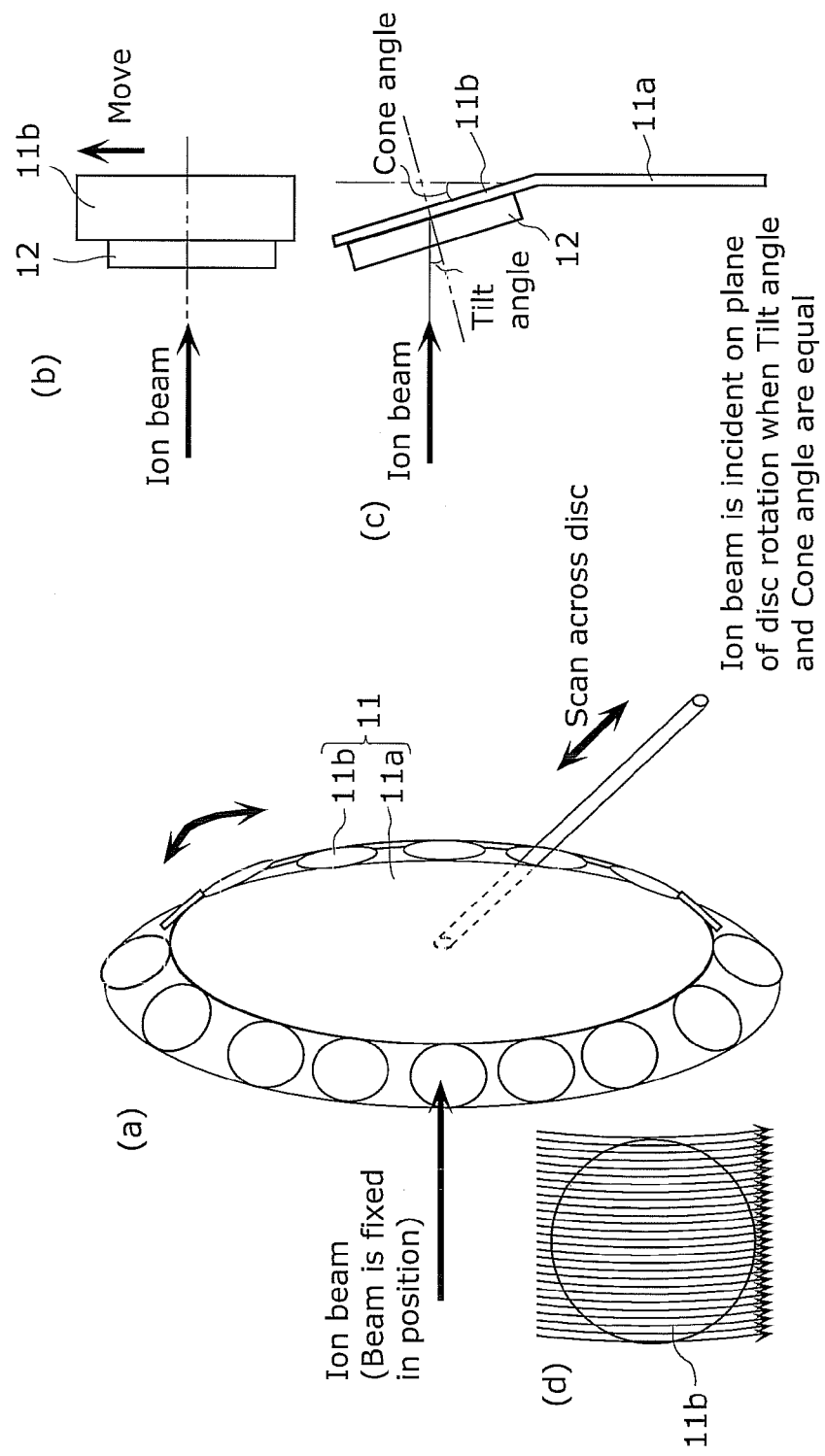
FIG. 1 shows schematic views of a configuration of a batch ion implantation apparatus.

Parts (a), (b), (c), and (d) of FIG. 1 are schematic views of a batch ion implantation apparatus having a conventional structure. As shown in (a) of FIG. 1, the batch ion implantation apparatus includes a disc 11 which includes a disc rotation unit 11a and a plurality of wafer placement units 11b. As shown in (b) of FIG. 1, a wafer 12 is placed on the wafer placement unit 11b. As shown in (c) of FIG. 1, the wafer placement units 11b are formed at the periphery around the disc rotation unit 11a so as to have a predetermined angle relative to the front surface of the disc rotation unit 11a.

In the batch ion implantation apparatus shown in FIG. 1, the ion beam is fixed in position and does not move. The ion beam is emitted uniformly to all of a plurality of wafers 12 by mechanically scanning the wafer 12, rotating the disc 11. To this end, multiple numbers of wafers 12 are, typically, placed at the periphery around a large disc (Hereinafter, referred to as the disc rotation unit 11a.) which has a diameter of about 100 cm.

The disc 11 rotates at high speed (900 to 100 rpm). Thus, the disc rotation unit 11a on which the wafer 12 is placed has, on the periphery, the wafer placement units 11b angled, called Cone angle, toward the center of the disc (typically, about 5 degrees) so that the wafer 12 does not fly out by centrifugal force.

It should be noted that the disc rotation unit 11a may not have a disc shape and may have a so-called daisy wheel which has a plurality of small discs for placing the wafers 12 thereon at spokes extending radially from the center of rotation. In this case also, the small discs on which the wafers 12 are placed are angled by Cone angle. The disc 11 rotates at high speed and is linearly scanned in a direction perpendicular to the rotation direction. Thus, the locus of the ion beam on the wafer 12 describes arcs as shown in (d) FIG. 1.

Here, since the wafer placement unit 11b is angled by Cone angle, the ion beam is not incident perpendicularly to the wafer 12 while the ion beam is incident perpendicularly to the disc 11. The ion beam is obliquely (Tilt) incident on the wafer 12 at Cone angle. If Cone angle and Tilt angle, which is an angle of incidence of the beam relative to the wafer 12, are equal, the rotation axis of the disc 11 and the axis of the ion beam coincide with each other. Thus, the angle (Tilt angle) formed between the ion beam and the wafer 12 is consistent at any portion of the wafer 12 even when the ion beam scans an arc over the wafer 12.

However, since the ion beam describes an arc on the periphery of the wafer 12, an angle (Twist angle) in a planar direction of the wafer 12 on which the ion beam is incident is different between the center and periphery of the wafer 12, while Tilt angle is constant. In other words, ions are doped to the periphery of the wafer 12 in different directions at a constant Tilt angle. Thus, the channeling is sensitive to the plane-channeling even if Tilt angle is formed. Additionally, when there are structures such as gates and resist, portions of the wafer that are shaded by the ion beam are different between the center and periphery of the wafer 12, and amounts of the ion beam which penetrates below the structures are also different.

If Cone angle and Tilt angle are not equal (typically, Tilt angle is, in many cases, 7 degrees, and Cone angle is, in many cases, 5 degrees or less), error occurs in Tilt angle between the center and periphery of a wafer, in addition to the error in Twist angle.

Figure 2:
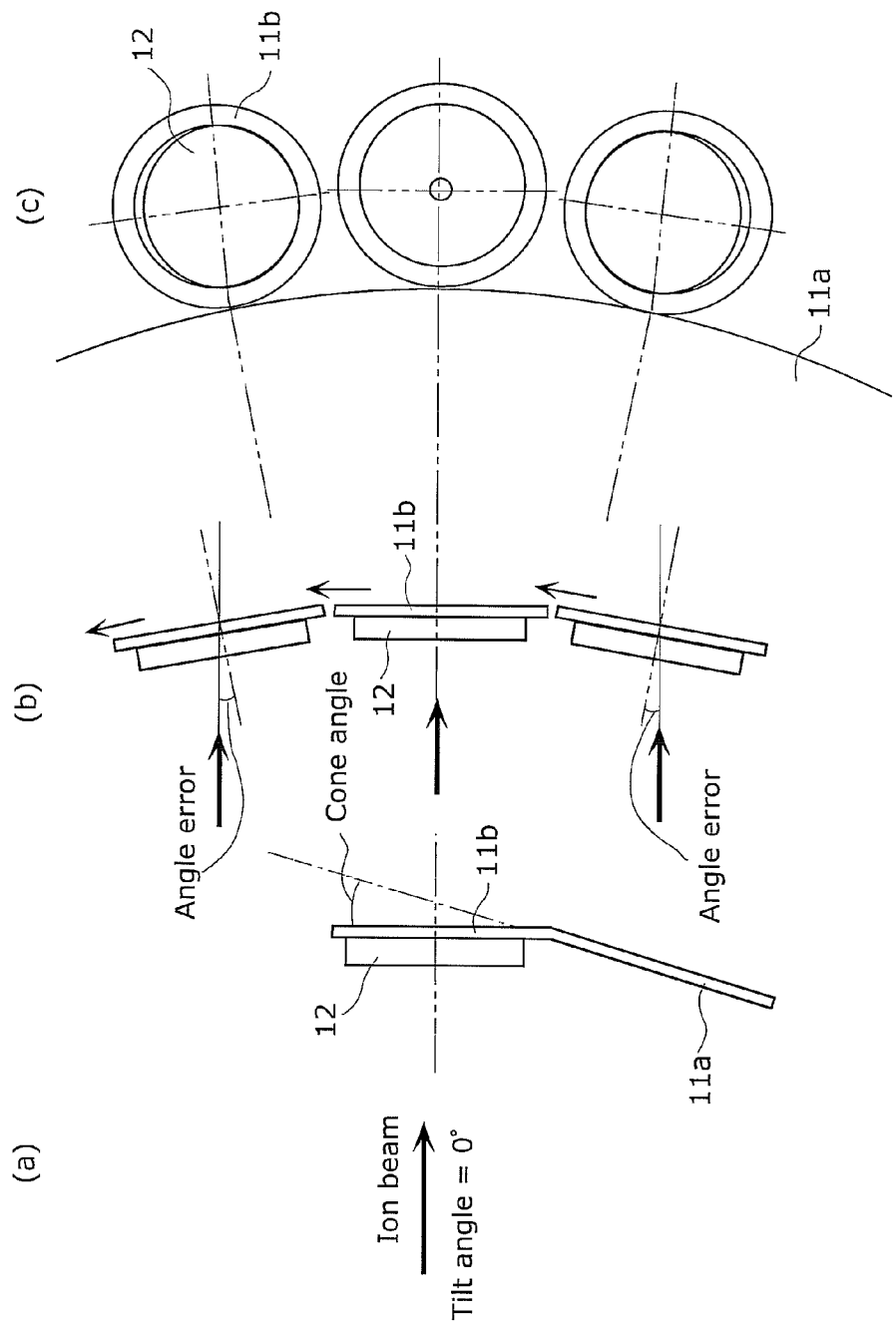
FIG. 2 shows schematic views of detailed configuration of the batch ion implantation apparatus.

Parts (a), (c), and (c) of FIG. 2 give further description of this. Parts (a), (c), and (c) of FIG. 2 are schematic views of the configuration of the batch ion implantation apparatus. For clarity, one wafer is shown in the figure. Also, to make clear the error in Tilt angle, it is considered that the ion beam is incident perpendicularly to the wafer 12 at Tilt angle of zero degree.

To set the angle between the wafer and the ion beam to zero degree, it is necessary that the entirety of the disc is titled at Cone angle. Thus, as shown in (a) of FIG. 2, the rotation axis of the disc 11 and the axis of the ion beam have an error corresponding to Cone angle. As shown in (b) of FIG. 2, when the wafers 12 are viewed from above, distances of the ion beam to the wafers 12 are not constant. When the wafer 12 (the center of the wafer 12) is on the axis of the ion beam, the ion beam is incident perpendicularly to the wafer 12. On the other hand, when the wafer 12 moves away from the ion beam to the left or right due to rotation, the axis of the ion beam and the surface of the wafer 12 have an angle error. Thus, on the periphery of the wafer 12, the ion beam is not incident perpendicularly to the wafer 12.

For example, when Cone angle is 5 degrees and the wafer 12 has 200 mm diameter, despite that Tilt angle is zero degree at the center of the wafer 12, Tilt angle on the periphery of the wafer 12 has an error of ±1.1 degrees. When an error occurs in Tilt angle, Twist angle (which causes no effect upon scanning arcs when the ion beam is incident perpendicularly) is problematic, which is not problematic when Tilt angle is zero degree. The error in Twist angle is ±6.3 degrees which is significantly large as compared to the error of ±1.1 degrees in Tilt angle.

In other words, the ion implantation apparatus having the conventional structure, theoretically, causes a large error in both Tilt angle and Twist angle on the periphery of the wafer 12 both when Tilt angle is formed and when Tilt angle is zero degree. Therefore, conventionally, there has been no choice but to form such a large Tilt angle as large as 7 degrees with consideration of the errors and also to prevent the channeling.

Figure 3:
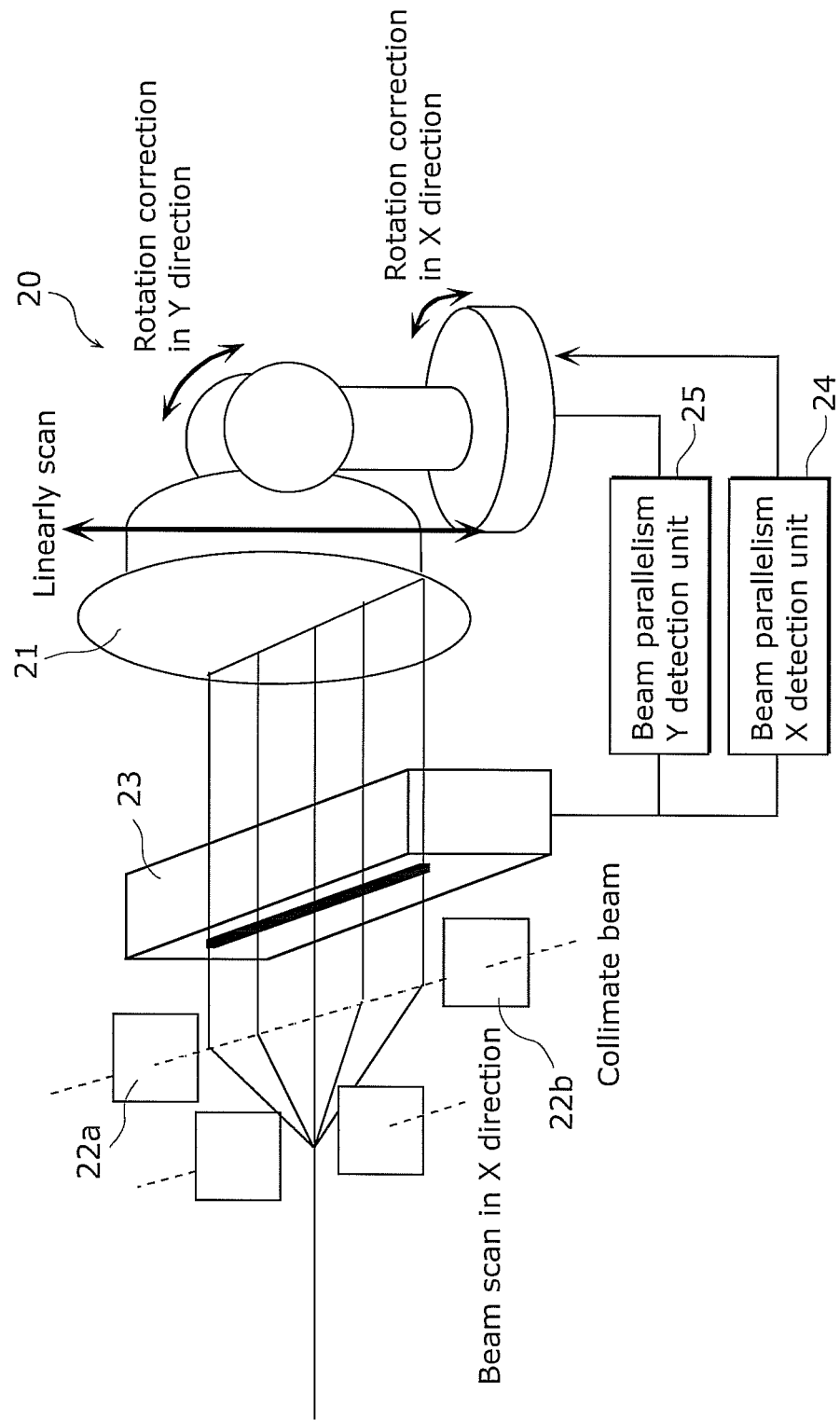
FIG. 3 is a schematic view of the configuration of a serial ion implantation apparatus.

On the other hand, FIG. 3 is a schematic view of the configuration of a serial ion implantation apparatus. The ion implantation apparatus shown in FIG. 3 has dramatically improved controllability of an angle formed between the ion beam recently developed and the wafer.

The serial ion implantation apparatus includes, as shown in FIG. 3, a platen 20, parallelizing electrodes 22a and 22b, a parallelism detection unit 23, a beam parallelism X detection unit 24, and a beam parallelism Y detection unit 25. The ion beam scans over a wafer 21 placed on the platen 20 in an X direction.

The ion beam is transformed into a collimated scan beam by the parallelizing electrodes 22a and 22b. By passing the ion beam through the parallelism detection unit 23, the beam parallelism X detection unit 24 and the beam parallelism Y detection unit 25 detect the beam parallelism in the X direction and in a Y direction, respectively.

Here, the serial ion implantation apparatus has a mechanism in which if deviation of the beam is detected in the Y direction, the platen 20 having the wafer 21 placed thereon is rotated vertically (Y correction), thereby correcting so that the beam can be incident always perpendicular to the wafer 21. On the other hand, when the beam parallelism X detection unit 24 detects deviation of the beam angle, the platen 20 is rotated in the X direction (X correction), thereby controlling the angle formed between the beam and the wafer 21.

Here, the beam is assumed to be a spot beam which is required scanning at least in the X direction. In recent years, however, the so-called ribbon beam is also used which has a length of about 400 mm in the X direction. In that case also, similar operation is performed for the angle correction. The ribbon beam, however, is expected to have beam divergence in the X direction, in which case a single correction only in the X correction may be insufficient. In that case, a mechanism may be added which improves the beam divergence itself by providing feedback to the beam shaping.

A recent ion implantation apparatuses (for example, the above-described serial ion implantation apparatus) employs a mechanism which detects angular deviation of a beam relative to an ideal locus, and compensates for the angular deviation by correcting the angle of the platen 20. Use of the mechanism allows stable control of the angle formed between the beam and the wafer 21 within an error of at least ±0.15 degree, and, normally, ±0.1 degree.

As described above, the batch ion implantation apparatus requires Off angle of the front surface relative to (100) plane to be at a minimum of 4 degrees or greater. When Off angle is increased, however, the front surface of a wafer on which semiconductor devices are formed, of course, deviates from (100) plane on which the semiconductor devices should be formed. Thus, the interface state density of the front surface of the wafer tends to increase and electron and hole mobility decrease, which may cause an increase in interface state that affects device characteristics, among others, the drive strength of an MOS transistor and white spot defect with imaging devices.

Moreover, if the ion implantation apparatus has variations in Tilt angle to the in-wafer-plane, the wafer has a portion that is shaded by the structures, such as resist and gate electrodes, due to the angle error. As a result, ions are doped asymmetry. For example, the shadowing width is reduced to 16.8 nm when Tilt angle for the ion implantation has an error of ±1.6 degrees, as compared to a portion of the wafer shaded by the resist of 600 nm, that is 73.6 nm (600 nm×tan 7 degrees) extending from the edge of the resist, when Tilt angle is 7 degrees. However, in the so-called fine CMOS devices which have gate lengths of 45 nm, 32 nm, 28 nm, and the like, the width of the shadowing is substantially the same as the gate length, and such asymmetry is not acceptable.

The angle error in the ion doping, as mentioned in the patent and non-patent literatures, includes angle error in Off angle, in addition to the angle errors in the ion doping, for example. Suppose that the ion beam divergence is ±2.4 degrees, Off angle needs to be increased. If Off angle is not increased, the state of the channeling significantly varies in the wafer-plane due to cutting a wafer from silicon ingot, mechanical angle error of the ion implantation apparatus, mechanical angle error in the ion doping, the ion beam divergence, and the like, plus the asymmetry of the ion doping, which may leads to variations in the characteristics of a fine CMOS transistor.

However, advances in recent wafer processing technology and ion doping technology have been remarkable, providing major advances in such wafer processing technology and ion doping technology. In the wafer processing, the setting of Off angle is controllable, typically, within an error of ±0.1 degree. It is easy to control Off angle so long as Off angle when cutting a wafer from silicon ingot can be set to a simple degree rather than such a complex degree as, for example, 3.5 degrees or greater relative to two directions perpendicular to (100) plane.

On the other hand, advances in ion implantation apparatus allow, for example, a serial ion implantation apparatus to control Tilt angle of the ion beam within an error of ±0.15 degree in a state where wafers are placed thereon.

Figure 4:
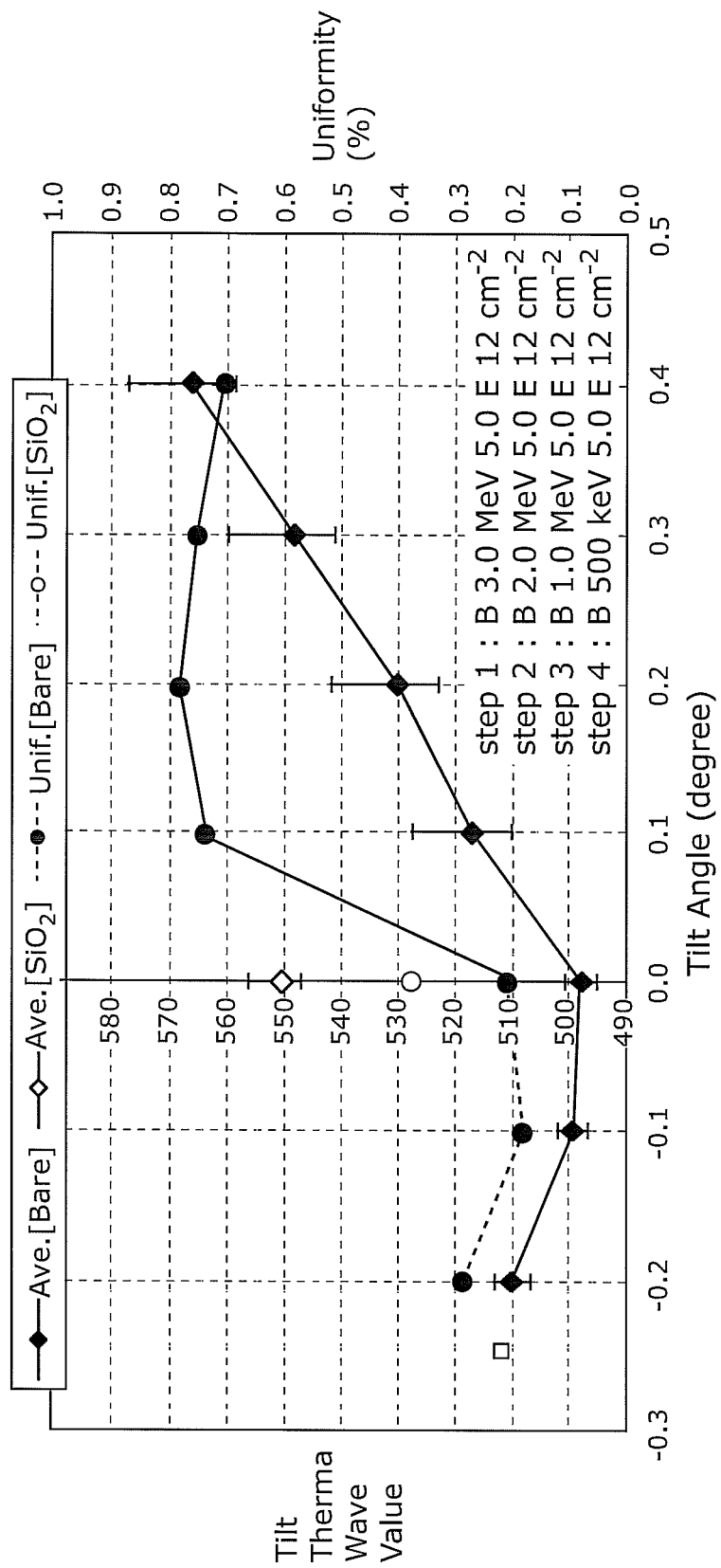
FIG. 4 is a diagram showing dependence of a channeling state on Tilt angle in the serial ion implantation apparatus.

FIG. 4 shows Tilt angle control of the serial ion implantation apparatus and the channeling state. FIG. 4 shows the occurrence of the channeling in the serial ion implantation apparatus, which can control Tilt angle within an error of ±0.1 degree, by, intentionally, changing Tilt angle each by 0.1 degree. Changes in Tilt angle are indicated on the horizontal axis, and a therma-wave signal as an indicator of the channeling is indicated on the vertical axis. The therma-wave signal is a signal indicative of crystal damage detected by therma-wave technology. When the channeling occurs, ions are doped deep into the substrate surface and crystal damage is reduced. Thus, the therma-wave signal value decreases. In other words, small therma-wave signal values indicate that the Tilt angle is under sufficient control (for example, Tilt angle is zero degree) and complete channeling has occurred.

FIG. 4 indicates small therma-wave signal values when Tilt angle is zero degree or below, from which it can be seen that the channeling is occurring. FIG. 4 shows that the device for use in the present invention can cause the complete channeling when the set Tilt angle is within an error ranging from +0.05 degree to −0.2 degree, in other words, within an error of about ±0.15 degree. Specifically, the figure shows that Tilt angle is fully controlled within the error of ±0.15 degree.

It should be noted that the channeling is not completely eliminated when the error in Tilt angle is ±0.2 degree or greater. While substantially complete channeling occurs when the error in Tilt angle is within the range of ±0.2 degree, an extent of the channeling which occurs when the error in Tilt angle is greater than ±0.2 degree is small. The variation in Tilt angle causes variations in ion doping in the wafer-plane or for each wafer, due to the occurrence of channeling.

A positive error angle and a negative error angle of Tilt angle are not in symmetry when Tilt angle is zero degree because precision in orientation of the wafer-plane still has a possibility of having an error of about ±0.1 degree.

Figure 5:
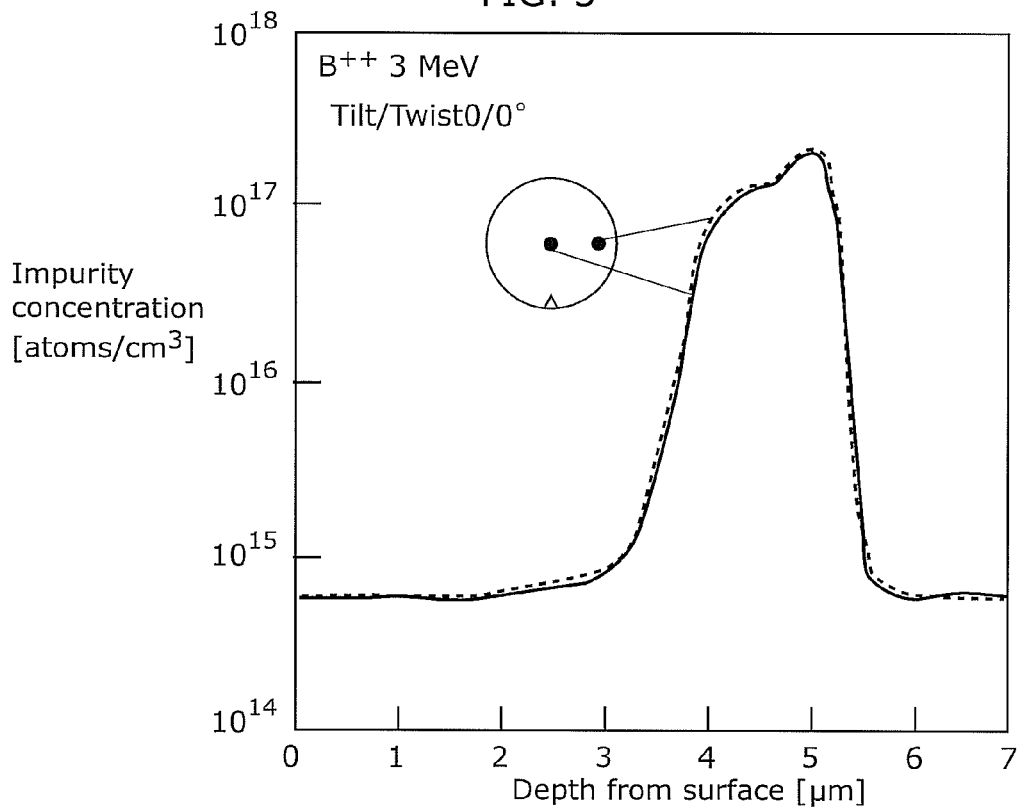
FIG. 5 is a diagram showing dependence of the channeling state on in-wafer-plane in the serial ion implantation apparatus.
Figure 6:
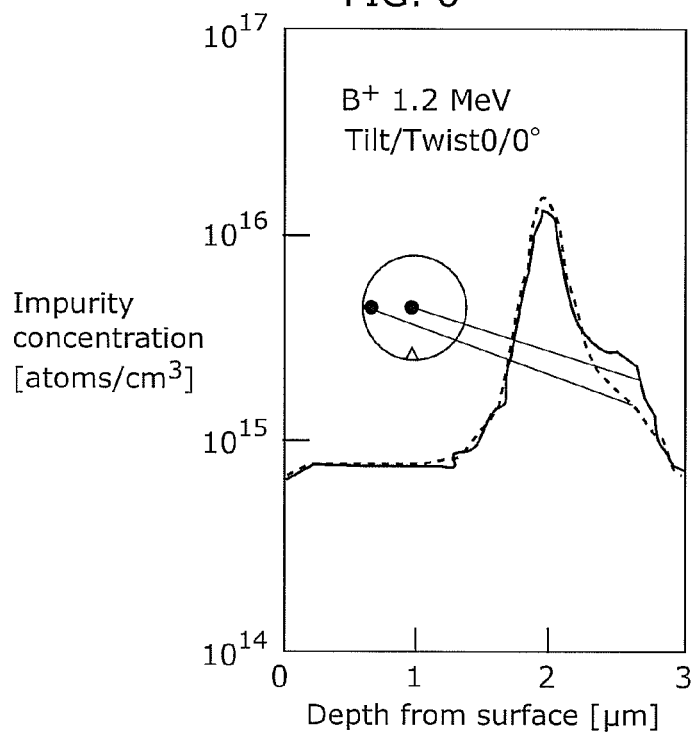
FIG. 6 is a diagram showing dependence of the channeling state on in-wafer-plane in the batch ion implantation apparatus.

FIG. 5 shows an SIMS profile in the depth direction when ions of $B^{++}$ (divalent boron) are doped at 3 MeV where the error in Tilt angle is controlled within ±0.15 degree. FIG. 6 shows an SIMS profile in the depth direction when ions of $B^+$ (monovalent boron) are doped at 1.2 MeV by a conventional batch ion implantation apparatus where the angle error in the wafer-plane is about ±1 degree.

In the serial ion implantation apparatus that can completely control Tilt angle, as shown in FIG. 5, distribution of impurity concentration shows bimodal (two peaks) distribution which includes, at both the center (solid line) and periphery (dashed line) of the wafer, a main peak (depth of near 4.2 μm from the surface) with no consideration of a range of movement of ions in an Si crystal due to the channeling, and a channeling peak (depth of near 5 μm from the surface) with consideration of the range movement of ions in an Si crystal due to the channeling. As compared to the main peak, the channeling peak indicates large impurity concentration, from which it is thus conceived that complete channeling has occurred.

In contrast, in the batch ion implantation apparatus, as shown in FIG. 6, distribution of impurity concentration indicates that the channeling peak (depth of near 2.7 μm from the surface) due to the channeling is small as compared to the main peak (depth of near 2 μm from the surface) at both the center (solid line) and periphery (dashed line) of the wafer. Moreover, the channeling peak at the periphery of the wafer is indicated being small as compared to that at the center of the wafer. In other words, it is conceived that the complete channeling does not occur even at the center of wafer at which Tilt angle is theoretically assumed to be zero degree, and less channeling occurs at the periphery of wafer at which the angle error of about ±1 degree is present.

In other words, if the beam angle in the ion doping is essentially under control, the channeling peak is greater than the main peak (which does not consider the channeling in the range of movement of ions in a Si crystal) when Tilt angle is zero degree. Additionally, difference in the channeling does not occur between the center and periphery of the wafer.

In contrast, the batch ion implantation apparatus has insufficient controllability of Tilt angle and the angle error in the wafer-plane is further magnified. Thus, the center and periphery of the wafer have a great difference in profile. Under the mechanism of the batch ion implantation apparatus, Tilt angle should not have an error at the center of the wafer. However, in fact, the channeling peak is instead smaller than the main peak and it is conceived that Tilt angle even at the center of the wafer has an error of about ±1 degree.

On the other hand, the angle error is further increased at the periphery of the wafer, and an error of about ±2 degrees is expected. In other words, it may be unavoidable, in view of the state of the art at that time, that the patent and non-patent literatures estimated the angle error of the ion implantation apparatus to be about 1.5 to about 2.5 degrees. At present, however, large advance is made in angle-control technologies of the ion implantation apparatus, and the values set to Off angle in the patent and non-patent literatures are now unreasonable and rather no more than degrading semiconductor device characteristics.

Figure 7:
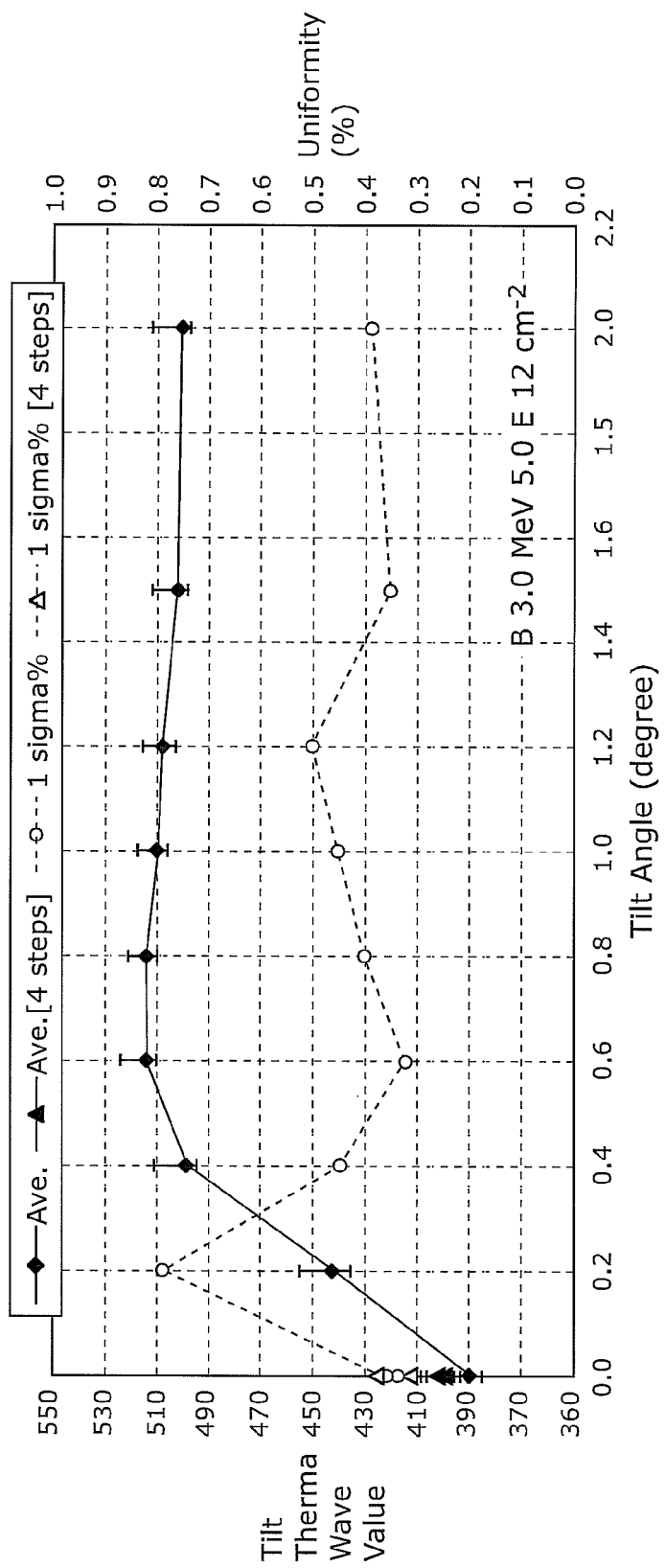
FIG. 7 is a diagram showing dependence of the channeling state on Tilt angle in the serial ion implantation apparatus.

FIG. 7 is a diagram showing dependence of the channeling state on Tilt angle in the serial ion implantation apparatus, indicating the therma-wave signal when Tilt angle is changed up to 2 degrees in the serial ion implantation apparatus.

As shown in FIG. 7, when Tilt angle is 0.6 degree or greater the therma-wave signal values are large indicating substantially a fixed value, as compared to when Tilt angle is less than 0.6 degree. This suggests rapid reduction of occurrence of the channeling when Tilt angle is 0.6 degree or greater. This suggests, conversely, that when the control of Tilt angle is extremely precise, the occurrence of the channeling can be inhibited if Tilt angle is about 2 degrees, in other words, Off angle is about 2 degrees.

Specifically, this mentions that while it has been believed that Tilt angle needs to be 3 to 7 degrees to inhibit the occurrence of the channeling, the channeling can be, in fact, prevented using a smaller Tilt angle or a smaller Off angle, insofar as Tilt angle and Off angle (wafer cutting angle from silicon ingot) are precisely controlled within errors of ±0.15 degree and ±0.1 degree, respectively.

An increased precision in cutting a wafer from silicon ingot (Off angle within an error of ±0.1 degree), improvement in angle-control technologies of the ion implantation apparatus (within an error of ±0.15 degree), and improvement in beam control technology allow for control so that variations in Off angle of the wafer can be reduced to ⅕ or below, and the error angle at the ion doping can be reduced to 1/10 to 1/15, as compared to conventional. A silicon wafer is prepared which has an Off angle, which is smaller than conventionally believed, from the front surface of the silicon wafer, and in one direction relative to the position of notch. Using the angle-controlled serial ion implantation apparatus described above, impurity ions are once doped at Tilt angle and Twist angle both of zero degree. In other words, a semiconductor device, which includes an MOS transistor that has no variation in device characteristics due to the channeling and no asymmetry due to the shadowing, can be provided highly productively and inexpensively by 1-step doping.

Figure 8A:
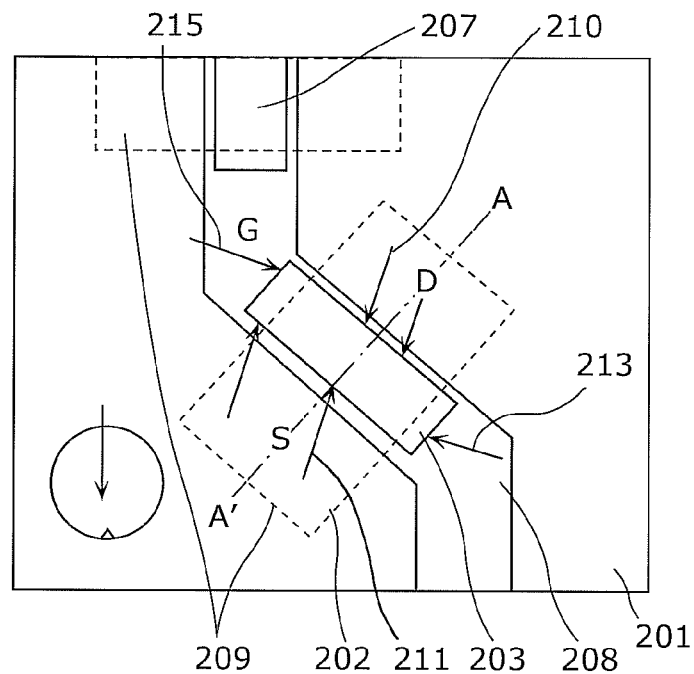
FIG. 8A is a top view of a wafer on which a transistor is formed.
Figure 8B:
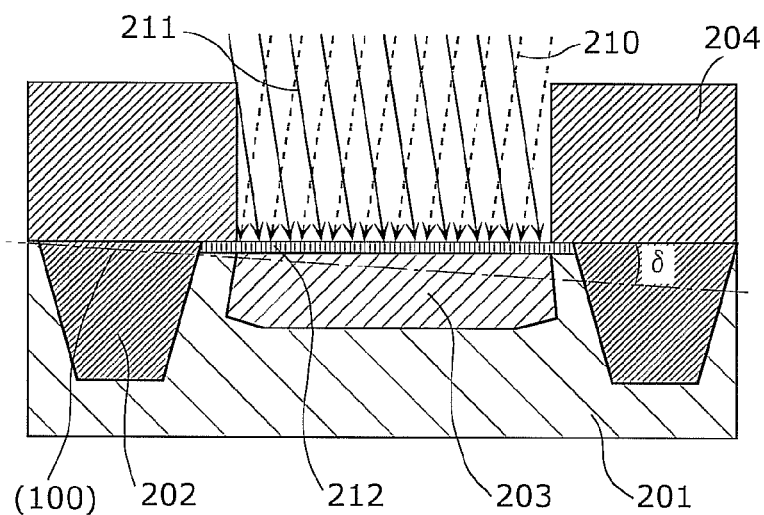
FIG. 8B a sectional view across A-A' of FIG. 8A.

Here, the shadowing will be described with reference to FIGS. 8A, 8B, and 8C. FIG. 8A is a top view of a wafer on which a transistor is formed. FIG. 8B is a sectional view across A-A' of FIG. 8A. FIG. 8C is a top view of a portion of the wafer of FIG. 8A.

The wafer 201 shown in FIGS. 8A to 8C has a plurality of transistors formed thereon. The wafer 201 includes an STI isolation region 202, channel doped regions 203 and 207, a photoresist pattern 204, a gate pattern 208, an active region 209, and a protective oxide film 212. The channel doped region 203 includes a channel doping region 217 and a shadowing region 218.

As shown in FIG. 8C, when ions are doped in different directions at a predetermined Tilt angle, the shadowing region 218 occurs to which ion beams 210, 211, 213, and 215 are not emitted due to the structures such as the gate pattern 208 and the photoresist pattern 204. The shadowing regions 218 are different in size and shape between the center and periphery of the wafer 201, and amounts of the ion beams 210, 211, 213, and 215 that penetrate below the structures are different as well. The channeling may occur despite that Tilt angle is formed. Thus, the depth of the ion doping is affected by the plane-channeling. This causes variations in the depth of the ion doping, causing variations in threshold voltage of the transistors.

As seen in FIG. 8A, however, impurities are doped into the channel doped regions 203 and 207 when the ion beams 210, 211, 213, and 215 are emitted in the stated order at an angular difference of 90 degrees therebetween when the wafer 201 is viewed from above (hereinafter, referred as 4-step doping). If the channel doped regions 203 and 207 exist, 4-step doping cannot inhibit the asymmetry and 8-step (360 degrees/45 degrees) doping is required. This ends up with a considerably reduced productivity.

Here, description will be given that even the use of 4-step doping cannot fully reduce the variations in threshold voltage, with reference to FIGS. 8A to 8C.

When step doping is performed, the ion beams 210 and 211 are tilted about 23 degrees relative to the normal direction (toward the sidewall of the photoresist pattern 204) of the wafer 201 as shown in FIG. 8A, to inhibit the plane-channeling. In other words, the ion beams 210 and 211 have Tilt angles of about 23 degrees. Thus, the angles (Twist angles) of the ion beams relative to the notch direction, that can prevent the plane-channeling, is 23 degrees+(multiples of 90 degrees) in 4-step doping (23 degrees+(multiples of 45 degrees) for 8-step doping).

Originally, in the wafer 201 shown in FIGS. 8A to 8C, a notch is formed in <0-11> direction, and the transistors are formed in eight directions parallel with, perpendicular to, degrees, and 225 degrees relative to the notch direction<0-11>. Thus, the ion beams are emitted at Twist angles for the above-mentioned 8-step doping. However, for the sake of simplicity, herein, consider 4-step doping.

As shown in FIG. 8C, if the ion doping is performed at angles for 4-step doping, the ion beams are shaded by the photoresist pattern 204 and portions (the shadowing region 218) into which no ion is doped are not parallel with but obliquely to the sidewall of the resist.

In other words, as shown in FIG. 8C, the shadowing region 218 is in a trapezoidal shape when viewed from above. In 4-step doping, however, ion doping is performed, changing twice the direction to the same sidewall of the resist by 180 degrees, and thus there is no region into which no ions are doped at all. 4-step doping commingles portions of the wafer that are doped with ½, ¾, and ¼ the amount of ions. In other words, despite that ions are doped into the channel doping region 217 by all the 4 steps of ion doping, only ¼ to ¾ the dosage are doped into the shadowing region 218, and regions in the wafer 201 that are near the sidewall of the photoresist pattern 204. For 8-step ion doping, distribution of the dosage in the shaded portions of the wafer 201 is subdivided, and difference in dosage is small as whole. In other words, as shown in FIG. 8B, the channel doped region 203 has small impurity concentration and the depth of impurity dosage is shallow near the in-plane of the wafer 201 near the sidewall of the photoresist pattern 204.

The variations in threshold voltage can be inhibited by minimizing Tilt angle and increasing the number of steps (8 steps or 16 steps). However, this considerably increases the number of times ions are doped, ending up reducing the productivity. Of course, ions are not doped in fully symmetry either. Reduction of the shadow of resist is possible down to 31 nm when Tilt angle is reduced to 3 degrees, as compared to 74 nm of the shadow of resist at the maximum when Tilt angle is 7 degrees. However, according to a method for manufacturing a semiconductor device described below with reference to embodiments, a semiconductor device, which includes an MOS transistor that has no characteristic variation due to the channeling and no asymmetry due to the shadowing can be manufactured by one ion doping (1-step doping).

First Embodiment

A method for manufacturing a semiconductor device according to a first embodiment of the present invention will be described, with reference to the accompanying drawings.

Figure 9A:
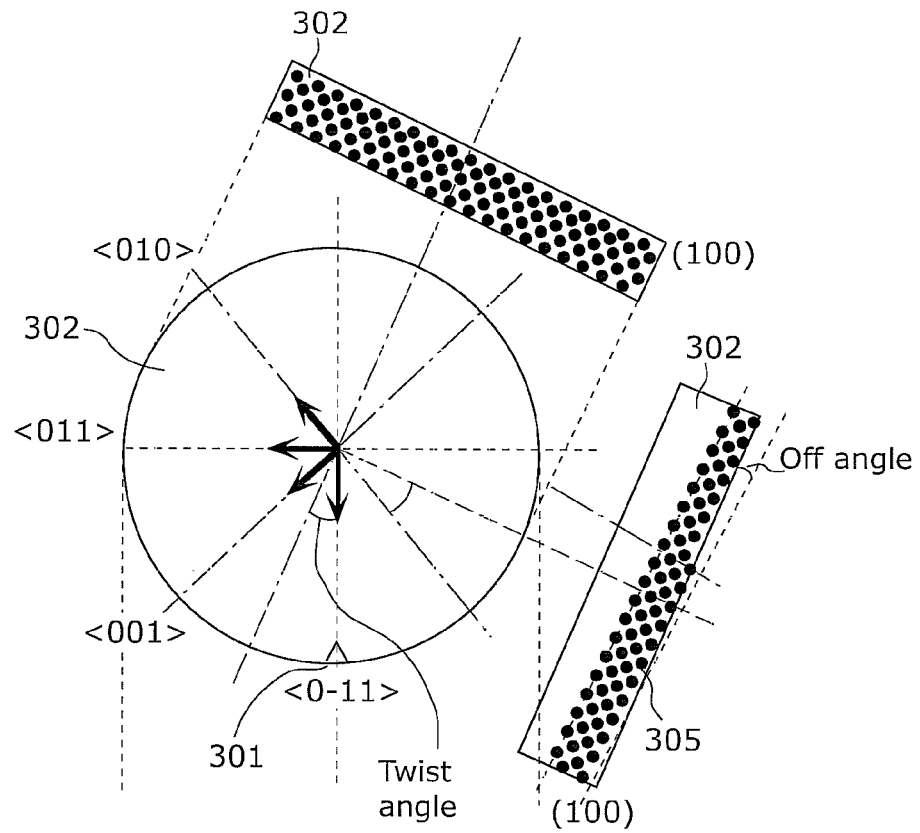
FIG. 9A is a plan view and a sectional view of a wafer according to a first embodiment.

FIG. 9A shows a plan view and a sectional view of a wafer 302 according to the first embodiment. FIG. 9A shows Off angle and a direction Off angle of the front surface of the wafer 302 in the present embodiment. FIG. 9A is also a schematic view of the structure of an MOS transistor formed on the wafer 302 that has Off angle from (100) plane.

The method for manufacturing the semiconductor device according to the present embodiment includes: a step of preparing a semiconductor substrate which has the front surface having Off angle of at least 2 degrees and at most 2.8 degrees from (100) plane of the semiconductor substrate in a direction of Twist angle of 22.5±10 degrees from the notch direction; and a step of doping impurities into the front surface of the semiconductor substrate in the vertical direction relative to the front surface. This can manufacture a semiconductor device which includes an MOS transistor in which the variations in threshold voltage caused by variations in depth of the ion doping due to the channeling are reduced and the asymmetry due to the shadowing is reduced.

The wafer 302 shown below is prepared as the semiconductor substrate.

As shown in FIG. 9A, a notch 301 is formed at the periphery of the wafer 302 in <0-11> direction. The notch 301 represents a direction of the crystallographic axis of the wafer 302. It should be noted that a direction extended between the center of the wafer 302 and the notch 301 will be referred to as notch direction. The wafer 302 is a semiconductor substrate which includes boron-doped P+ having the resistivity of 10 to 16 mΩcm. A boron-doped P-type epitaxial thin film having a film thickness of 5 μm and an epitaxial resistor of 10 to 15 Ωcm is formed on the semiconductor substrate. The notch is not limited to be formed in <0-11> direction, and may be formed in other direction.

As shown in FIG. 9A, it is assumed that Off angle of the front surface of the wafer 302 is 2.8 degrees, and the direction of Off angle is a direction rotated by 22.5 degrees clockwise from the notch direction<0-11>. In other words, (100) plane is observed as the front surface of the wafer 302 at a cross section at which the wafer 302 is cut in a direction perpendicular to a direction of Twist angle of 22.5 degrees from the notch direction<0-11>, and it is observed that the front surface of the wafer 302 is tilted at Off angle of 2.8 degrees from (100) plane at a cross section at which the wafer 302 is cut in a direction of Twist angle of 22.5 degrees from the notch direction.

The direction (Twist angle) of Off angle is impervious to the channeling characteristics, specifically, is a direction in which the channeling phenomenon hardly occurs in the ion doping. Twist angle may be at least 12.5 degrees and at most 32.5 degrees, in other words, within 22.5±10 degrees. Preferably, Twist angle is 22.5±5 degrees, and more preferably, 22.5 degrees.

While the above-mentioned batch ion implantation apparatus is unable to precisely adjust angles across the in-waferplane in the ion doping, the above-mentioned serial ion implantation apparatus can precisely adjust angles across the in-wafer-plane in the ion doping. Thus, Off angle may have an error of ±0.1 degree. Hereinafter, description will be given assuming that Off angle is 2.8±0.1 degrees inclusive of errors.

Figure 9B:
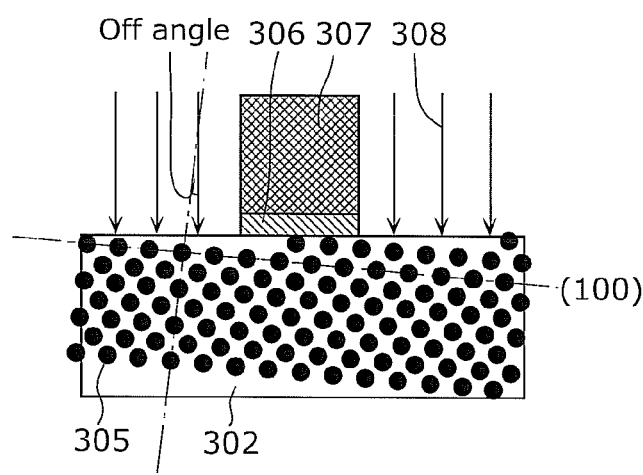
FIG. 9B is a sectional view of the wafer on which a gate electrode is formed.

FIG. 9B is a sectional view of the wafer 302 on which a gate electrode 307 is formed, and is a sectional view at which the wafer 302 is cut in a direction of Twist angle of 22.5 degrees from the notch direction. FIG. 9B also shows the wafer (substrate) 302 according to the present embodiment having formed thereon the gate electrode 307 of the MOS transistor. The gate electrode 307 comprising a multi-crystalline silicon electrode is formed on a gate oxide 306.

As shown in FIG. 9B, the gate electrode 307 is a structure which has a sidewall perpendicular to the front surface of the wafer 302. For doping ions into the wafer 302, an ion beam 308 is incident perpendicularly to the front surface of the wafer 302 when Tilt angle is zero degree. Thus, no portion of the wafer 302 is shaded by the gate electrode 307, and no asymmetry occurs in ion doped regions.

Figure 9C:
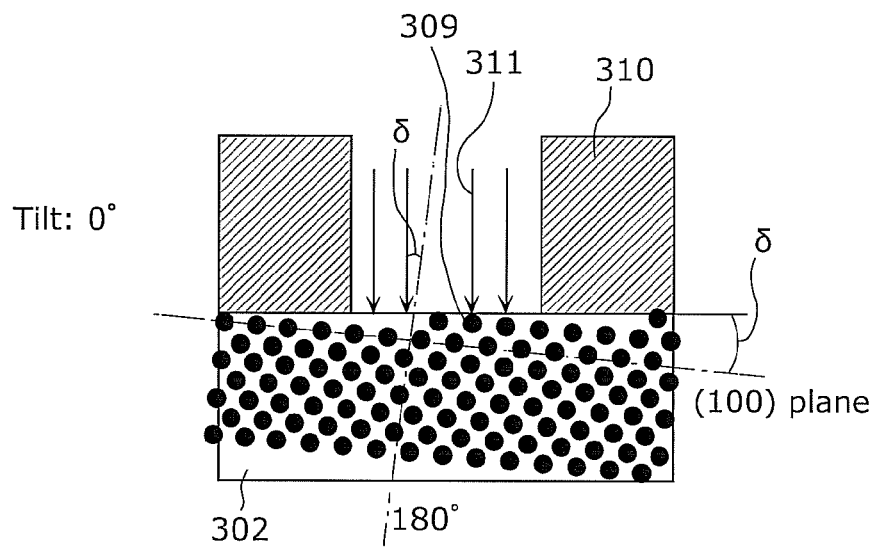
FIG. 9C a sectional view of the wafer when ions are to be doped thereon.
Figure 9D:
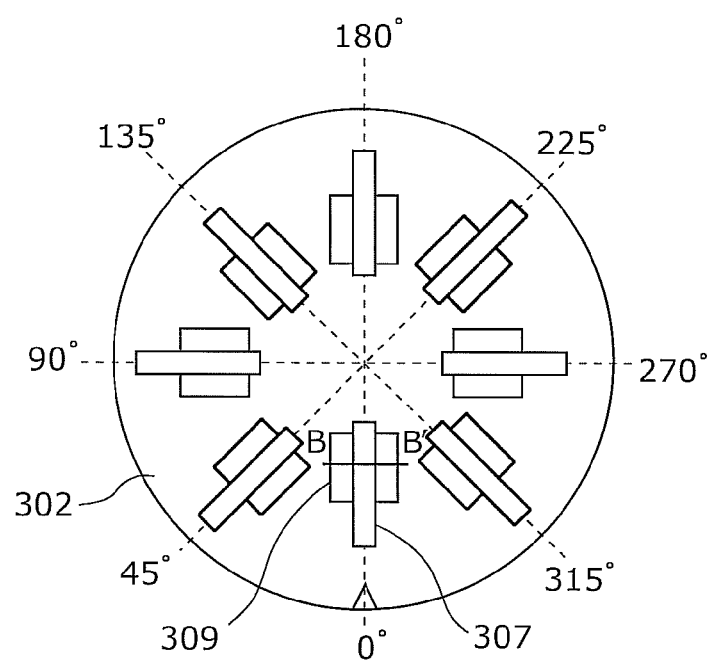
FIG. 9D is a top view of the wafer which has transistors formed on the front surface.

FIG. 9D is a top view of the wafer 302 having transistors formed on the front surface. FIG. 9D shows typical arrangement of transistors which has channels in <0-11> direction parallel with the notch direction<0-11>, <011> direction perpendicular to the notch direction<0-11>, and, furthermore, directions ±45 degrees relative to the notch direction. In the arrangement, it is understood that the gate electrodes 307 and active regions 309 of the transistors are formed in eight directions as well as the channel directions of the transistors. While eight transistors are shown in FIG. 9D, the number of transistors is not limited to eight and may be greater than eight insofar as the transistors are formed in the above-stated directions. Alternatively, the semiconductor device may be formed in <0-11> direction parallel with the notch direction<0-11> and <011> direction perpendicular to the notch direction<0-11>, or in <001> direction and <010> direction which are 45 degrees relative to the notch direction<0-11>.

FIG. 9C is a sectional view of the wafer 302 at the ion doping. FIG. 9C is a sectional view of the wafer 302 across B-B' line shown in FIG. 9D to dope ions into the active region 309, such as the channel doping, for adjusting the threshold voltage. Since the wafer 302 has Off angle of 2.8±0.1 degrees in a direction of Twist angle of 22.5 degrees from the notch direction, as shown in FIG. 9C, (100) plane at the cross section in the direction of B-B' line that is perpendicular to the notch direction has a predetermined angle δ from the front surface of the wafer 302. An ion beam 311 is emitted to the active region 309 in a direction perpendicular to the front surface of the wafer 302 on which a photoresist pattern 310, which is a mask, is disposed.

As shown in FIG. 9D, due to the channels of the transistors in eight directions (at every 45 degrees), the transistors having the gate electrodes 307 or the photoresist patterns 310 exist in directions parallel with and perpendicular to the notch direction, and the transistors having the gate electrodes 307 or the photoresist patterns 310 exist in directions 45 degrees and 225 degrees relative to the notch direction.

While in the present embodiment, the channel directions of the gates are of eight rotations each 45 degrees relative to the notch direction, other angles may be present. In that case, in the present embodiment, advantageous effects of the channel directions remain no matter what degree the channel directions have relative to the notch direction. However, in terms of design compatibility with conventional technologies, there is no good reason to take on channel orientations of the transistors other than primary orientations of the wafer 302 which are <100> (directions rotated by 45 degrees and 225 degrees relative to the notch formed in <1-11> direction) and <110> (a direction parallel with or perpendicular to the notch when formed in <0-11> direction). Thus, the eight directions that are related to the channel directions <100> and <110> are described in the present embodiment.

It should be noted that the channel directions of the transistors may include all the eight directions described above, may include only <110> direction (perpendicular to or parallel with the notch in <0-11> direction), or only <100> (a direction which is rotated by 45 degrees or 225 degrees relative to the notch direction <0-11> and parallel with or perpendicular to the notch formed at the periphery of the wafer 302 in <001> direction).

Next, the first embodiment will be described, with reference to a flow diagram.

Figure 10A:
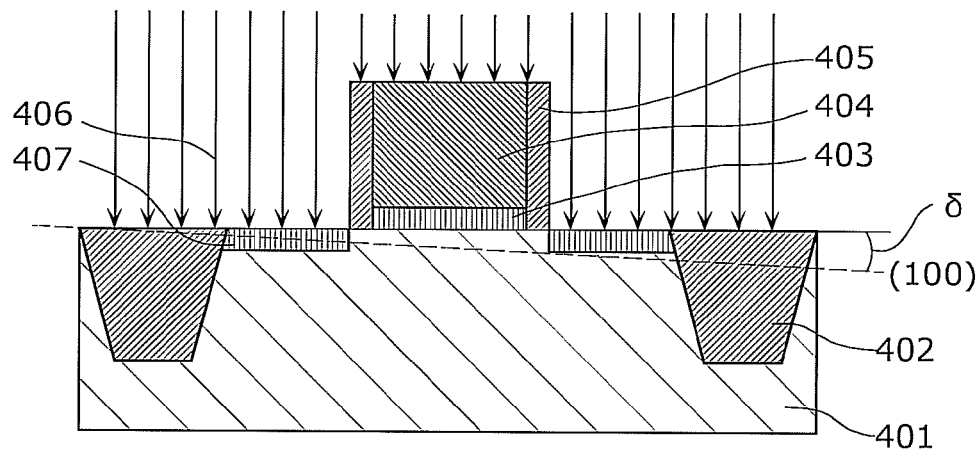
FIG. 10A is a diagram showing a step of doping impurities into the wafer according to the first embodiment.

An embodiment will be described in which the extension doping is performed on a wafer 401 which comprises silicon and has Off angle of 2.8 degrees from (100) plane in a direction of 22.5 degrees clockwise from the notch direction <0-11>. As shown in FIG. 10A, the silicon wafer 401 includes at least an STI isolation region 402, a gate insulating film 403, a gate electrode 404 having a polysilicon film, and an offset sidewall 405. In the present embodiment, an NMOS region which is an N-channel transistor is shown. Thus, initially, ion doping is performed for forming a channel region (not shown) for adjusting threshold voltages at P-well region and the NMOS.

Moreover, the gate insulating film 403 comprising a SiON film of 2.0 nm is formed, and the gate electrode 404 comprising multi-crystalline silicon having a film thickness of 120 nm is formed. Ions are doped into the gate electrode 404 by P ion doping. Moreover, the offset sidewall 405 comprising $SiO_2$ film of 6 nm formed by ALD (Atomic Layer Deposition) is formed. In this state, the serial ion implantation apparatus performs ion doping (an extension doping) 406 to form an extension region 411, by doping ions of As in $8E14/cm^3$ ($8 \times 10^{14}/cm^3$) at 1.5 keV where Tilt angle is 0±0.15 degree. Since Tilt angle is controlled to zero degree, Twist angle does not affect a result of the doping. As a result, an extension region 407 is formed symmetric to the in-plane of the wafer 401 and the transistors in all the direction, without being formed directly below the offset sidewall 405. It should be noted that the extension region 411 laterally diffuses below the offset sidewall 405 by later heat treatment.

Figure 10B:
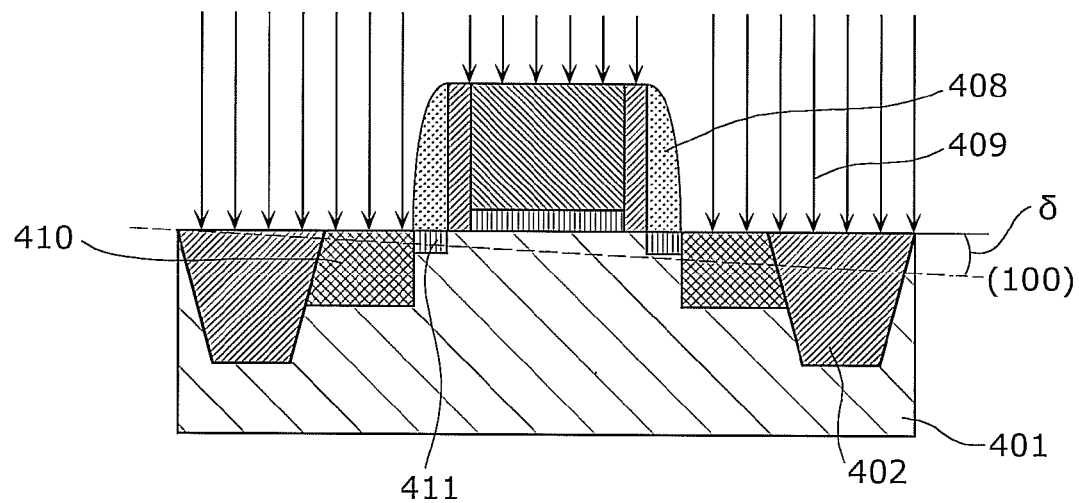
FIG. 10B is a diagram showing a step of doping impurities into the wafer according to the first embodiment.

Subsequently, as shown in FIG. 10B, a sidewall 408 comprising SiN of 35 nm by the ALD method is formed, and the serial ion implantation apparatus again performs ion doping (the source-drain doping) 409 to form a source-drain region 410. A source-drain doping 409 is performed by doping ions of As in $5E15/cm^3$ ($5 \times 10^{15}/cm^3$) at 8 keV where Tilt angle is 0±0.15 degree and Twist angle is zero degree. As a result, the source-drain region 410 is formed symmetric to the transistors in all the directions in the plane of the wafer 401.

In this case also, ions are not doped directly below the sidewall 408 as with the extension doping. It should be noted that the source-drain region 410 also laterally diffuses below the sidewall 408 by later heat treatment.

Figure 11A:
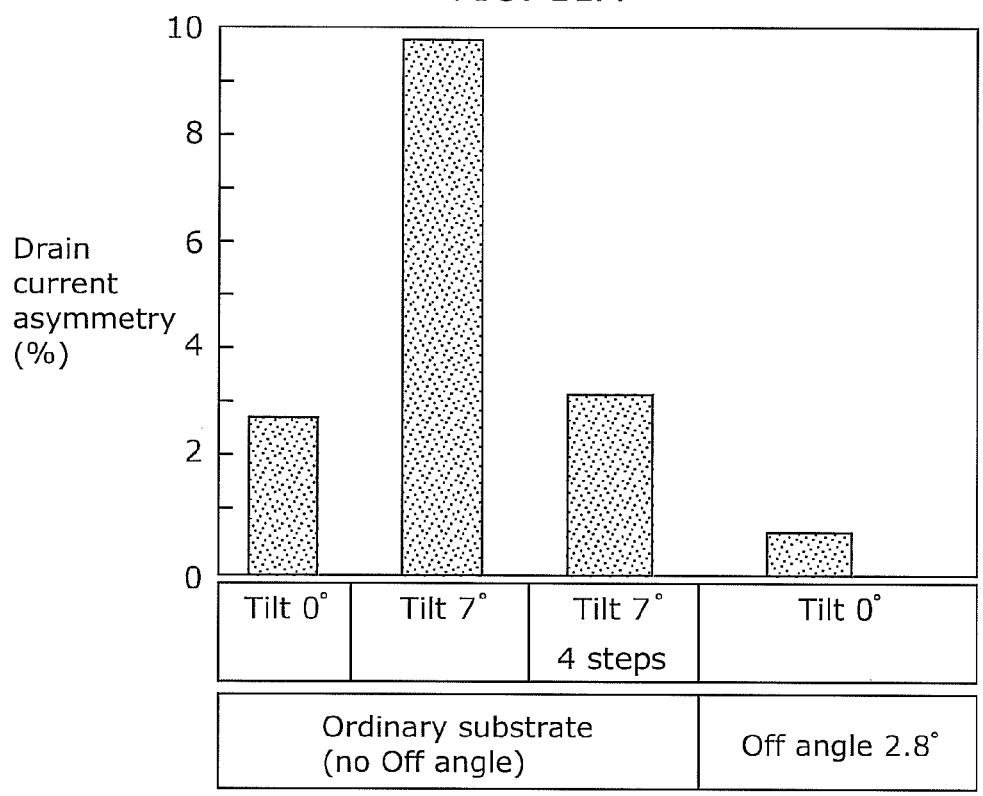
FIG. 11A is a diagram showing variations in Vt at the extension doping and the source-drain doping.
Figure 11B:
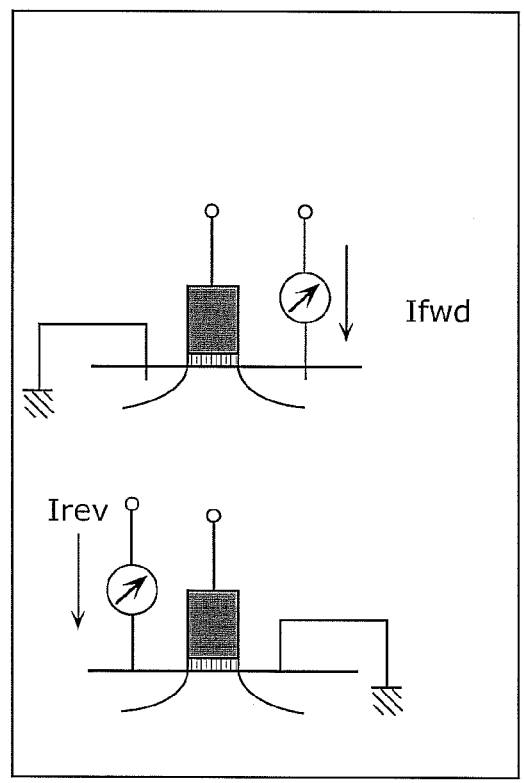
FIG. 11B is a diagram showing a derivation for the variations in Vt in FIG. 11A.

FIGS. 11A and 11B show drain current asymmetry in the extension doping 406 and the source-drain doping 409 in cases where: ions are doped at Tilt angle of 7 degrees; ions are doped at Tilt angle of 7 degrees in 4 steps in which the wafer is rotated each by 90 degrees relative to <0-11> notch direction; ions are doped at Tilt angle of zero degree; and ions are doped, at Tilt angle of zero degree, into a wafer which has Off angle of 2.8 degrees according to the present embodiment in a direction of 22.5 degrees relative to <0-11> notch direction. The drain current asymmetry is obtained by measuring currents flowing between a source and a drain in directions indicated by Ifwd and Irev, as shown in FIG. 11B, and calculating the ratio between the currents.

As shown in FIG. 11A, when Tilt angle is 7 degrees, a shaded portion of 14.7 nm is created in one direction of a gate electrode of 120 nm. Thus, asymmetry in the drain current exceeds 10% and has no practical use.

On the other hand, while 4-step ion doping at Tilt angle of 7 degrees eliminates the shadowing region, ½ the amount of ions is doped into the shadowing region 14.7 nm offset from the structure. However, the asymmetry is mitigated. Also, short-channel characteristics, the threshold voltage, and the drain current itself significantly change.

When Tilt angle is zero degree, the asymmetry increases if there is an angle error across in-wafer-plane or if the angle control by the ion implantation apparatus is insufficient as mentioned above. Even the use of the ion implantation apparatus which has high angle controllability according to the present embodiment does not allow for sufficient symmetry because of non-uniformity due to the channeling, although the asymmetry is eliminated.

In comparison, when the serial ion implantation apparatus having high angle controllability dopes ions at Tilt angle of zero degree into a wafer having Off angle of 2.8 degrees, a significant improvement is indicated that the asymmetry is 1% or below. It is conceived that the asymmetry exists, whereas, theoretically, the asymmetry does not occur, because the gate electrode does not have perfectly vertical shape and the amount of ions doped into the wafer-plane varies.

In any case, by doping ions into a wafer having Off angle of 2.8 degrees where the ion beam is controlled so as to form Tilt angle of zero degree, the extension doping and the source-drain doping which have no channeling and no asymmetry are achieved.

Second Embodiment

Figure 12A:
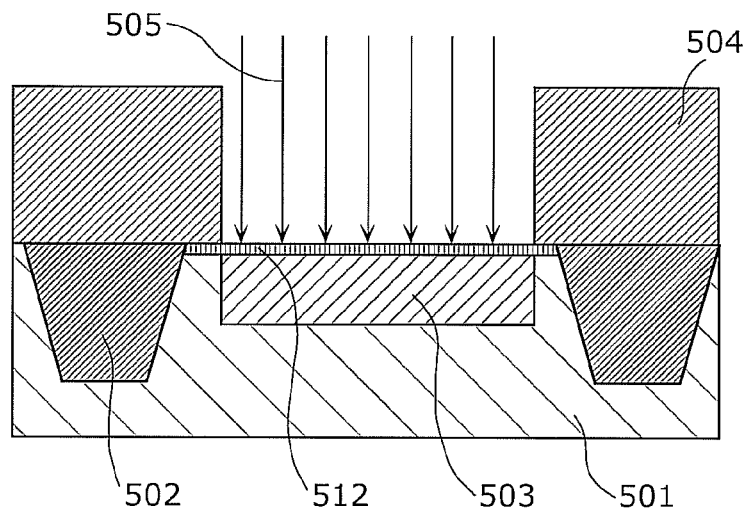
FIG. 12A is a diagram showing a step of doping impurities into a wafer according to a second embodiment.
Figure 12B:
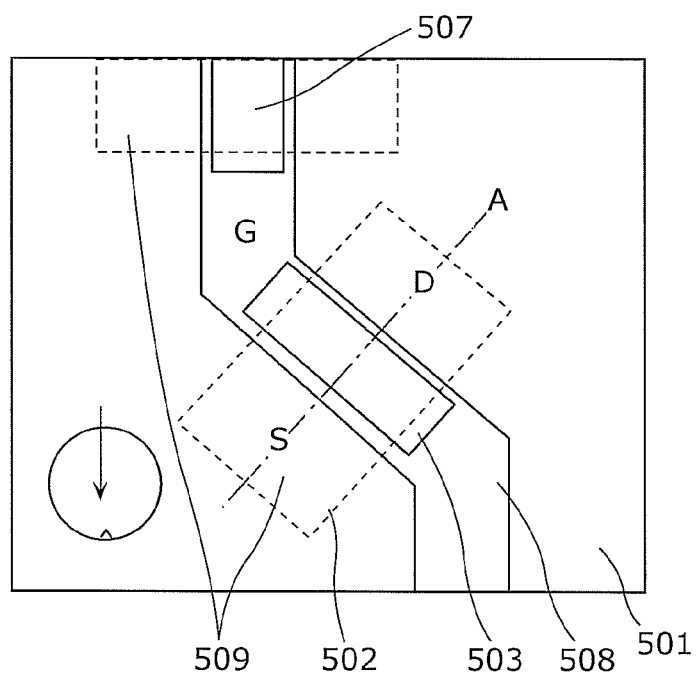
FIG. 12B is a top view of a wafer on which a transistor is formed.

Next, referring to FIGS. 12A and 12B, a second embodiment will be described. FIG. 12A shows the gate electrode in the channel doping, STI isolation, and a mask layout for the channel doping according to the second embodiment. FIG. 12B is a sectional view of the device structure according to the second embodiment.

In FIGS. 12A and 12B, a wafer 501 is a silicon wafer which has a front surface having Off angle of 2.8 degrees relative to (100) plane. The wafer 501 includes an STI isolation region 502, channel doped regions 503 and 507, a photoresist pattern 504, a gate pattern 508, an active region 509, and a protective oxide film 512. The photoresist pattern 504 has a film thickness of 600 nm.

While in the present embodiment, description is given with respect to channel doping for NMOS, the embodiment is similar for PMOS except that ionic species are different. Moreover, while NMOS is formed within P-well, the P-well is not shown in the present embodiment.

As shown in FIG. 12B, the gate pattern (which does not exist at this moment) 508 is formed in a direction parallel with and 45 degrees relative to the notch orientation <0-11> direction. The active region 509 is formed also in a direction parallel with and 45 degrees relative to the notch orientation <0-11> direction. Furthermore, the channel doped regions 503 and 507 are formed in the same manner. The channel doped regions 503 and 507 do not overlap with the STI isolation regions 502 in channel directions of the transistors whereas the channel doped regions 503 and 507 overlap with the STI isolation regions 502 in directions perpendicular to the channel directions.

FIG. 12A is a sectional view across A-A' of FIG. 12B. Thus, the photoresist pattern 504 for the channel doping is more inward of the active region 509 than the STI isolation region 502 is. In such a situation, the photoresist pattern 504 is greater in height than the gate electrode. Thus, the greater the Tilt angle is, among others, as 3 to 7 degrees, the larger the portion shaded by the photoresist pattern 504 in the wafer. Simple mathematics indicates that the portion shaded by the photoresist pattern 504 extends 73.7 nm when the resist film thickness is 600 nm and Tilt angle is 7 degrees.

Despite that it is desired that the overlaps of the channel doped regions 503 and 507 with the STI isolation region 502 and the source-drain in the active region 509 are as small as possible, close to 74 nm of overlap is necessary when Tilt angle is 7 degrees. Typically, the photoresist pattern 504 has a rectangular shape in many cases. Thus, for one photoresist pattern, the ion doping may be performed in 4 steps each at 90 degrees in a direction perpendicularly toward the sidewall of the photoresist pattern.

In the present embodiment, as shown in FIG. 12A, an ion beam 505 is incident onto the wafer at Tilt angle of zero degree and perpendicular to the front surface, thereby precisely forming the channel doped region 503. In the present embodiment, the serial current ion implantation apparatus is used to adjust Tilt angle of the beam to zero degree, thereby ions of $B^+$ in $5E13/cm^3$ ($5 \times 10^{13}/cm^3$) are doped at 20 keV.

Figure 13:
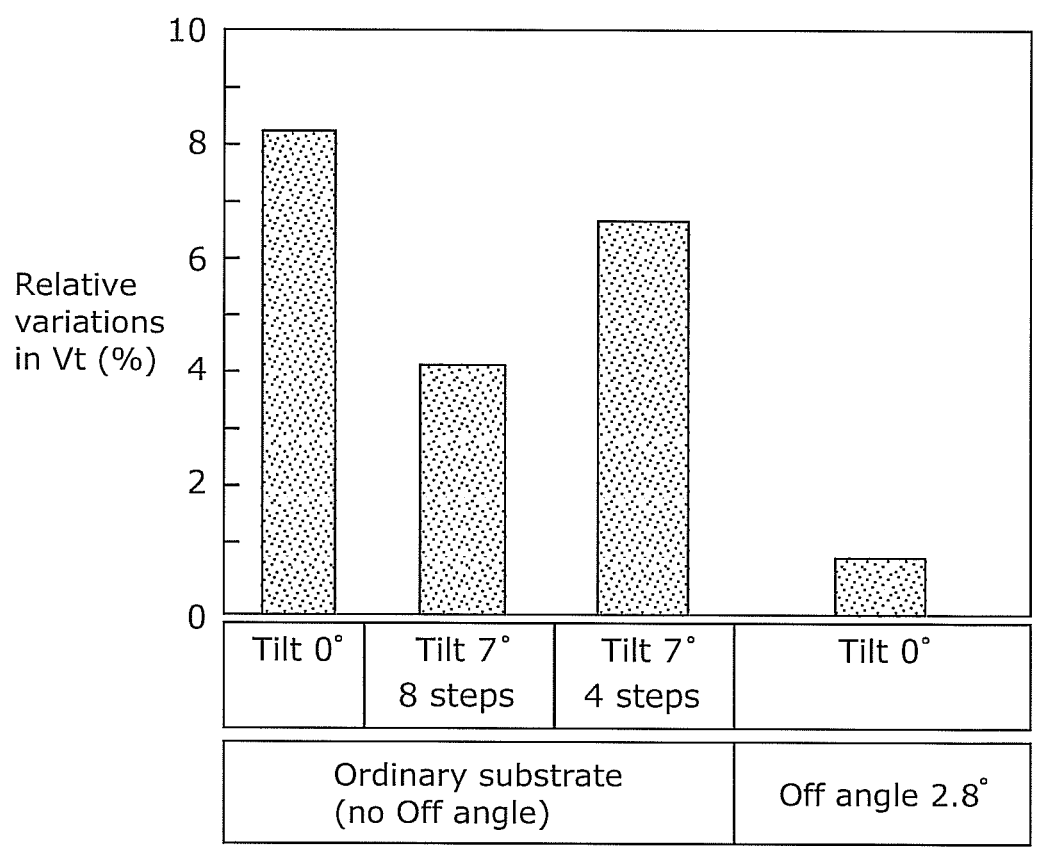
FIG. 13 is a diagram showing variations in threshold voltage Vt at the channel doping.

FIG. 13 is a diagram showing the comparison in variations in threshold voltage Vt of an NMOS transistor formed on the front surface having Off angle of 2.8 degrees from (100) plane by controlling Tilt angle of the ion beam to zero degree between cases where: 8-step ion doping is performed into a conventional silicon substrate at Tilt angle of 7 degrees; 4-step doping is performed at Tilt angle of 7 degrees on the silicon substrate; and ion doping is performed at Tilt angle of zero degree on the silicon substrate.

The variations in threshold voltage when ions are doped at Tilt angle of 7 degrees into the substrate by 4-step doping is 7%, and the variation in 8-step ion doping is 4%. Variations when ions are doped at Tilt angle of zero degree is, due to the channeling, 8%.

In contrast, the variations in threshold voltage are reduced to 1% in the present embodiment. It should be noted that the present embodiment is effective when ions are doped perpendicularly (Tilt angle is zero degree) onto the front surface, and is not applicable for ion doping where Tilt angle is as large as 20 to 45 degrees.

Figure 14:
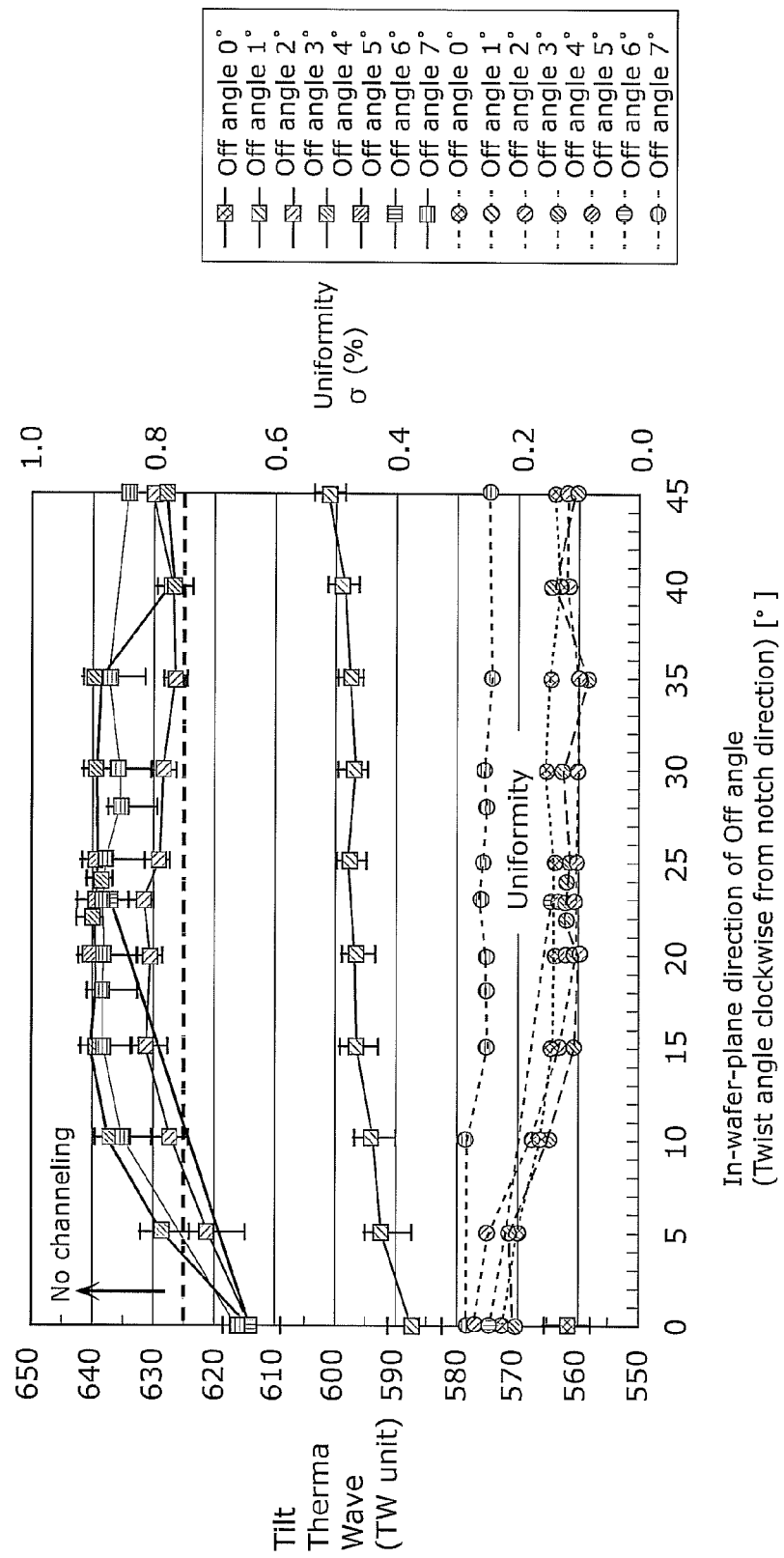
FIG. 14 is a diagram showing a relationship between Off angle, in-wafer-plane direction (Twist angle) of Off angle, and the channeling.

FIG. 14 shows changes in channeling characteristics where Off angle of the front surface of the silicon wafer from (100) plane is changed from 1 degree up to 7 degrees while Twist angle is rotated clockwise from the notch. A therma-wave signal as an indicator of the channeling is indicated on the vertical axis. A lower therma-wave signal value indicates greater channeling. The therma-wave signal value extremely decreases when the channeling occurs.

First, the channeling is observed when the direction of Off angle from the notch (in this case, a direction from <0-11> the notch orientation) is near zero degree and near 45 degrees. This can be observed for any Off angle. It can be seen from this result that a direction of Off angle for a minimum channeling is near 22.5 degrees. Since the dependence of channeling characteristics on the direction of Off angle is not sensitive, it can be seen that the direction of Off angle may be about 22.5±10 degrees.

For Off angle, the channeling is observed when Off angle is 1 degree while no channeling is observed when Off angle is 2 degrees. The channeling characteristics are stable when Off angle is at least 2 degrees and at most 7 degrees. Thus, it can be seen that Off angle may be 2 degrees or greater.

It is understood, however, that a large Off angle causes a number of adverse effects. According to a study conducted by the inventors, in view of the current precision within an error of ±0.1 degree in cutting a wafer from silicon ingot and the current controllability of Tilt angle of ion beam within an error of ±0.15 degree by the ion implantation apparatus, the beam angle control within an error of about ±0.2 degree in total is possible.

Figure 15:
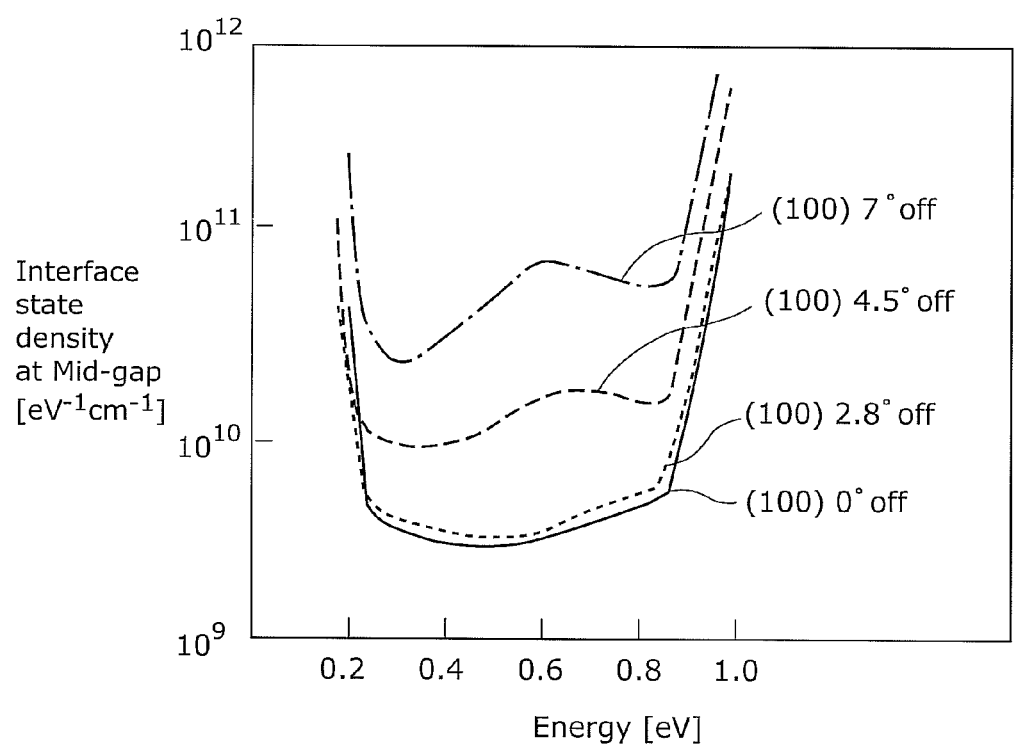
FIG. 15 is a diagram showing changes in interface state density relative to Off angle from (100) plane.

FIG. 15 is a diagram showing results of measuring the interface state density of an MOS capacitor comprising $SiO_2$ gate oxide film which has a film thickness of 8 nm, when Off angle from (100) plane is changed to zero degree, 2.8 degrees, 4.5 degrees, and 7 degrees. As shown in FIG. 15, the interface state densities when Off angle is 2.8 degrees and zero degree are substantially equal. However, when Off angle is 4.5 degrees or greater, the interface state density rapidly deteriorates. Likewise, when Off angle is 4.5 degrees or greater, electron and hole mobility at interfaces in the MOS transistor decline as well. Thus, reduction in drain current is of concern when Off angle is large. In recent years, a method is used which improves electron and hole mobility by applying strain to a transistor; tensile strain for an NMOS and compressive strain for a PMOS. This, however, also has a concern with an increased Off angle over the extent of improvement in the electron and hole mobility, or the threshold voltage. Thus, it is conceived from FIG. 15 that greater than or equal to 2 degrees and less than or equal to 2.8 degrees is appropriate for Off angle, at most 3 degrees. Preferably, Off angle is as small as possible.

As described above, according to the method for manufacturing the semiconductor device of the above embodiment, the ion doping which completely inhibit the channeling across the wafer-plane is possible by using wafers, in which Off angles relative to (100) planes of the wafers are at least 2 degrees and at most 2.8 degrees (the error is within ±0.1 degree) and the wafers are tilted in directions of 22.5±10 degrees clockwise from the notches of the wafers, and performing the ion doping on these wafers by emitting the ion beam at Tilt angle of 0±0.15 degree. As a result, a stabilized threshold voltage, or improved and stabilized drive strength of the transistor can be provided.

The above embodiment can inhibit the channeling as well, when Tilt angle is about 2 degrees. This allows for reduction in the interface state density of the semiconductor substrate, and improvement in electron and hole mobility. As a result, further stabilized interface properties of a fine MOS device and improved drive strength of a transistor can be provided.

Moreover, using the method for manufacturing the semiconductor device according to the above embodiment by one-step ion doping can achieve inhibition of transistor characteristics which eliminates asymmetry that is caused by the ion beam being shaded by resist pattern or the structures such as a gate electrode.

Since the method for manufacturing the semiconductor device according to the present embodiment always emit the ion beam perpendicular to the front surface of the wafer (the semiconductor substrate), basically, no matter what direction, on the wafer-plane, the gate of the transistor or the photoresist pattern on the channel doped region are, ions can be doped by one-step ion doping, preventing the channeling and avoiding the asymmetry.

Thus, as compared to the conventional where ions are doped by 4-step doping or 8-step doping, one-step ion doping achieves great performance. Thus, the present invention is extremely advantageous in terms of productivity, in addition to the characteristics improvement. Conventional 4-step and 8-step ion doping has problems including: a problem that the ion doping cannot always be performed in a direction perpendicular toward a sidewall of a structure to prevent the plane-channeling; and problems in terms of performance and productivity that the beam current is reduced from a standpoint of ensuring uniformity since dosage per step is reduced. In contrast, the present invention solves such problems as well.

The present invention is not limited to the foregoing embodiments, and various other modifications and variations can be devised without departing from the scope of the invention.

For example, while the notch direction is <0-11> in the above embodiment, the notch direction may be other direction.

Both the first embodiment and the second embodiment have been described with reference to an epitaxial wafer which has an epitaxial layer on a single crystal silicon wafer or a single crystal silicon wafer, the advantageous effects remains even if the wafer is an SOI (Silicon on Insulator) wafer, insofar as only the front surface has Off angle of 2.8 degrees from (100) plane. Among others, for a bonding SOI wafer, an insulator which is a support substrate does not have Off angle. Thus, a combination in which only S layer (silicon layer) has Off angle is alternatively possible. Moreover, application of the present invention to GaAs substrate is possible if (100) plane is employed.

Additionally, since the ion doping is possible across the wafer without angle error, starting from a 300 mm wafer, a 450 mm wafer or larger-diameter wafers can be accommodated as well.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

As described above, the present invention is related to the method for manufacturing a semiconductor device, and more particularly, to improve performance and reliability of the device, inhibiting variation in threshold of an MOS transistor or in drive current by preventing the channeling and asymmetry of ion doping.

The invention claimed is:

1. A method for manufacturing a semiconductor device which includes, on a semiconductor substrate having a notch, a plurality of transistors in parallel with and perpendicular to a notch direction extending between a center of the semiconductor substrate and the notch, the method comprising:
preparing the semiconductor substrate which has a front surface having an Off angle of at least 2 degrees and at most 2.8 degrees from (100) plane in a direction in which a Twist angle relative to the notch direction is at least 12.5 degrees and at most 32.5 degrees; and
doping impurities into the front surface of the semiconductor substrate in a direction perpendicular to the front surface.

2. The method for manufacturing the semiconductor device according to claim 1,
wherein the Twist angle is 22.5 degrees.

3. The method for manufacturing the semiconductor device according to claim 1,
wherein the notch is formed at a periphery of the semiconductor substrate in <0-11> direction, and
the plurality of transistors are formed on the semiconductor substrate in the <0-11> direction and <011> direction, or in <001> direction and <010> direction.

4. The method for manufacturing the semiconductor device according to claim 1,
wherein the notch is formed at a periphery of the semiconductor substrate in <0-11> direction, and
the plurality of transistors are formed on the semiconductor substrate in the <0-11> direction, <011> direction, <001> direction, and <010> direction.

5. The method for manufacturing the semiconductor device according to claim 1,
wherein an error angle of the Off angle is within ±0.1 degree.

6. The method for manufacturing the semiconductor device according to claim 1,
wherein the vertical direction is a direction of 0±0.15 degree relative to the front surface of the semiconductor substrate.

7. The method for manufacturing the semiconductor device according to claim 1,
wherein doping the impurities is to form channel regions of the plurality of transistors.

8. The method for manufacturing the semiconductor device according to claim 1,
wherein doping the impurities is to form source-drain regions of the plurality of transistors.

9. The method for manufacturing the semiconductor device according to claim 1,
wherein doping the impurities is to form extension regions of the plurality of transistors.

10. The method for manufacturing the semiconductor device according to claim 2,
wherein the notch is formed at a periphery of the semiconductor substrate in <0-11> direction, and
the plurality of transistors are formed on the semiconductor substrate in the <0-11> direction and <011> direction, or in <001> direction and <010> direction.

11. The method for manufacturing the semiconductor device according to claim 2,
wherein the notch is formed at a periphery of the semiconductor substrate in <0-11> direction, and
the plurality of transistors are formed on the semiconductor substrate in the <0-11> direction, <011> direction, <001> direction, and <010> direction.

12. The method for manufacturing the semiconductor device according to claim 2,
wherein an error angle of the Off angle is within ±0.1 degree.

13. The method for manufacturing the semiconductor device according to claim 2,
wherein the vertical direction is a direction of 0±0.15 degree relative to the front surface of the semiconductor substrate.

14. The method for manufacturing the semiconductor device according to claim 2,
wherein doping the impurities is to form channel regions of the plurality of transistors.

15. The method for manufacturing the semiconductor device according to claim 2,
wherein doping the impurities is to form source-drain regions of the plurality of transistors.

16. The method for manufacturing the semiconductor device according to claim 2,
wherein doping the impurities is to form extension regions of the plurality of transistors.

\* \* \* \* \*